(12) United States Patent
Kawasaki

(10) Patent No.: US 7,298,188 B2
(45) Date of Patent: Nov. 20, 2007

(54) TIMING ADJUSTMENT CIRCUIT AND MEMORY CONTROLLER

(75) Inventor: Kenichi Kawasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/020,418

(22) Filed: Dec. 27, 2004

(65) Prior Publication Data
US 2005/0242850 A1 Nov. 3, 2005

(30) Foreign Application Priority Data
Apr. 30, 2004 (JP) .............................. 2004-136248
Oct. 8, 2004 (JP) .............................. 2004-296469

(51) Int. Cl.
*H03L 7/00* (2006.01)
(52) U.S. Cl. ...................... 327/153; 327/161
(58) Field of Classification Search ............... 327/147, 327/149, 153, 158, 161, 163; 331/17, 25, 331/DIG. 2; 375/373–376
See application file for complete search history.

(56) References Cited

U.S. PATENT DOCUMENTS 6,636,093 B1 * 10/2003 Stubbs et al. ............... 327/161
6,677,791 B2 * 1/2004 Okuda et al. ............... 327/158
6,822,481 B1 * 11/2004 Srikantam et al. ............ 326/93

FOREIGN PATENT DOCUMENTS

JP 10-112182 4/1998
JP 2003-151271 5/2003

* cited by examiner

*Primary Examiner*—Linh My Nguyen
(74) *Attorney, Agent, or Firm*—Arent Fox LLP.

(57) ABSTRACT

A circuit for timing adjustment includes a PLL circuit configured to generate a phase-adjusted clock signal in response to phase comparison between an input clock signal and a delayed clock signal, a feedback path configured to delay the phase-adjusted clock signal for provision as the delayed clock signal to the PLL circuit, a first timing correction circuit configured to add a predetermined delay time to the feedback path, an output data circuit configured to supply output data at first timing responsive to the phase-adjusted clock signal, a second timing correction circuit configured to delay the first timing by the predetermined delay time to generate second timing different from the first timing, and an input data circuit configured to latch input data at the second timing.

20 Claims, 25 Drawing Sheets

TIMING ADJUSTMENT CIRCUIT AND MEMORY CONTROLLER

CROSS-REFERENCE TO RELATED APPLICATIONS

The present application is based upon and claims the benefit of priority from the prior Japanese Patent Applications No. 2004-136248 filed on Apr. 30, 2004 and No. 2004-296469 filed on Oct. 8, 2004, with the Japanese Patent Office, the entire contents of which are incorporated herein by reference.

BACKGROUND OF THE INVENTION

1. Field of the Invention

The present invention generally relates to timing adjustment circuits used in clock synchronous apparatuses, and particularly relates to a timing adjustment circuit for adjusting the timing of clock synchronization of a data input/output interface.

2. Description of the Related Art

FIG. 1 is an illustrative drawing showing an example of a construction in which semiconductor chips of the clock synchronous type are connected to each other. Chips 10 through 13 shown in FIG. 1 operate in synchronization with a clock signal. A data signal output from the chip 10 in synchronization with the clock signal is input into the chips 11 through 13. In respect of this, the setup time and hold time of the input signal, the maximum delay of the output signal, etc., are defined relative to the timing of the clock signal. The chips 10 through 13 are required to perform the inputting/outputting of the data signal at the timing that satisfies these specifications.

Semiconductor devices are bound to have manufacturing variation. The input/output cells for inputting/outputting data signals have delay fluctuation due to such manufacturing variation. Conventionally, such delay fluctuation has not been much of a problem. When the operation speed of semiconductor devices is increased by increasing the frequency of a clock signal, however, the problem of delay fluctuation of the input/output cells becomes apparent. Namely, if the input/output cells have delay fluctuation under the condition of high operating frequency, the setup time and hold time of input signals, the maximum delay of output signals, etc. may not be able to meet their requirements. This may result in a failure of data exchange between the chips. Further, there is an effect of differences in flight time caused by the differences of path lengths between the chips, and also an effect of an increase of the load caused by the connection of multiple chips to a single output node. These effects make it difficult to conduct reliable data exchange.

FIG. 2 is a circuit diagram showing an example of a timing adjustment circuit that corrects the timing of an input/output interface of the clock synchronous type. A timing adjustment circuit 20 of FIG. 2 includes a clock input circuit 21, a PLL (phase locked loop) circuit 22, a clock tree 23, a feedback tree 24, a flip-flop 25 for signal output, a input-purpose flip-flop 26 for signal input, a data output circuit 27, and a data input circuit 28.

The clock input circuit 21 receives a clock signal Clock supplied from the exterior of the chip, and supplies the received signal to the PLL circuit 22 as an input clock signal ck0. The clock input circuit 21 has an inherent delay time A. The input clock signal ck0 includes a delay equal to the delay time A relative to the clock signal Clock when supplied to the PLL circuit 22. The PLL circuit 22 adjusts the phase of the input clock signal ck0, and outputs a clock signal ckr having the adjusted phase. The clock signal ckr having the adjusted phase propagates through the clock tree 23 before it is supplied to the output-purpose flip-flop 25 and the input-purpose flip-flop 26 as a synchronizing clock signal ck1. Moreover, the clock signal ckr having the adjusted phase is supplied to another input of the PLL circuit 22 as a delayed clock signal ckf through the feedback tree 24, which has the same delay C' as the delay C of the clock tree 23. The PLL circuit 22 performs phase control such that the input clock signal ck0 and the delayed clock signal ckf have the same phase, thereby generating the clock signal ckr having the adjusted phase.

The output-purpose flip-flop 25 outputs output data d0 at edge timing of the synchronizing clock signal ck1. The output data d0 is output to the exterior of the chip as a data output signal DataOut by the data output circuit 27. The data output circuit 27 has an inherent delay time B, so that the data output signal DataOut has a delay equal to the delay time B relative to the output data d0.

The data input circuit 28 receives a data input signal DataIn supplied from the exterior of the chip, and supplies the received signal to the input-purpose flip-flop 26 as input data d1. The input-purpose flip-flop 26 latches the input data d1 at edge timing of the synchronizing clock signal ck1. The data input circuit 28 has an inherent delay time A, so that the input data d1 has a delay equal to the delay time A relative to the data input signal DataIn. The delay time of the data input circuit 28 and the delay time of the clock input circuit 21 are identical.

FIG. 3 is a timing chart showing the operation timing of the timing adjustment circuit 20 shown in FIG. 2. As shown in FIG. 3, the input clock signal ck0 is delayed by a delay equal to the delay time A relative to the clock signal Clock. The clock signal ckr having an adjusted phase is phase-adjusted such that the delayed clock signal ckf and the input clock signal ck0 have the same phase. Since the delay time C' of the delayed clock signal ckf is equal to the delay time C of the synchronizing clock signal ck1, the phase of the synchronizing clock signal ck1 coincides with the phase of the input clock signal ck0.

The input data d1 is latched at the edge timing of the synchronizing clock signal ck1. The delay of the synchronizing clock signal ck1 relative to the clock signal Clock and the delay of the input data d1 relative to the data input signal DataIn are the same delay time A. It follows that when the data input signal DataIn is supplied in synchronization with the clock signal Clock, the setup time and hold time are fixed regardless of the length of the delay time A. In this manner, the timing adjustment circuit 20 of FIG. 2 achieves data inputting at fixed timing free from the influence of manufacturing variation.

In FIG. 3, the timing at which the data output signal DataOut is output is delayed by a delay equal to the delay time B relative to the synchronizing clock signal ck1, i.e., is delayed by the delay time A+B relative to the clock signal Clock. This data output signal DataOut propagates from the chip 10 to the chip 20 as shown in FIG. 1, for example, by spending a flight time FT before receipt by the chip 20 as the data input signal DataIn. If the delay time A+B of the data output signal DataOut increases due to manufacturing variation, the input timing of the data input signal DataIn at the chip 20 is delayed proportionately. In this case, a sufficient setup time cannot be secured, which may result in a data input error.

FIG. 4 is a circuit diagram showing another example of the timing adjustment circuit that corrects the timing of an input/output interface of the clock synchronous type. In FIG. 4, the same elements as those of FIG. 2 are referred to by the same numerals, and a description thereof will be omitted.

A timing adjustment circuit 20A of FIG. 4 is provided with a dummy input/output circuit 29 in addition to the configuration of the timing adjustment circuit 20 shown in FIG. 2. The dummy input/output circuit 29 includes a dummy input circuit 21A having the same delay time A as the clock input circuit 21 and a dummy output circuit 27A having the same delay time B as the data output circuit 27. The dummy input/output circuit 29 thus has a total delay time equal to A+B. The dummy input/output circuit 29 is inserted into the feedback path for phase control, so that the delayed clock signal ckf input into the PLL circuit 22 has a delay time equal to A+B+C' relative to the clock signal ckr having the adjusted phase.

FIG. 5 is a timing chart showing the operation timing of the timing adjustment circuit 20A of FIG. 4. As shown in FIG. 5, the input clock signal ck0 is delayed by a delay equal to the delay time A relative to the clock signal Clock. The clock signal ckr having an adjusted phase is phase-adjusted such that the delayed clock signal ckf and the input clock signal ck0 have the same phase. The delayed clock signal ckf is delayed by the delay time A+B+C' relative to the clock signal ckr having the adjusted phase, and the data output signal DataOut is output with the delay C+B relative to the clock signal ckr having the adjusted phase. Accordingly, the data output signal DataOut is output a time A earlier than the delayed clock signal ckf. Since this delayed clock signal ckf is delayed by the delay time A relative to the clock signal Clock, the output timing of the data output signal DataOut is equal to the edge timing of the clock signal Clock. This timing match is maintained even if the delay times A, B, and/or C fluctuate due to manufacturing variation.

This data output signal DataOut propagates from the chip 10 to the chip 20 as shown in FIG. 1, for example, by spending a flight time FT before receipt by the chip 20 as the data input signal DataIn. The timing of the data output signal DataOut is fixed relative to the clock signal Clock regardless of manufacturing variation, so that the timing of the data input signal DataIn received at the chip 20 is also fixed to the clock signal Clock. Accordingly, this provision makes it possible to secure a proper setup time so as to attain reliable data inputting.

At the data input side of the timing adjustment circuit 20A shown in FIG. 4, the input data d1 is latched at the edge timing of the synchronizing clock signal ck1. The input data d1 is delayed by the delay time A relative to the data input signal DataIn, whereas the synchronizing clock signal ck1 is time B earlier than the clock signal Clock. (The synchronizing clock signal ck1 is delayed by the time A relative to the clock signal Clock in FIG. 3, but is time A+B earlier than this timing where the time A+B is the delay time of the dummy input/output circuit 29.) When the data input signal DataIn is supplied in synchronization with the clock signal Clock, the setup time and hold time fluctuate due to the variation of the time A and time B, resulting in difficulty securing the required timing conditions.

Patent Document 1 discloses an example in which a timing adjustment circuit for correcting the timing of an input/output interface of the clock synchronous type is applied to a memory device.

[Patent Document 1] Japanese Patent Application Publication No. 10-112182

If a timing adjustment circuit attends to timing control such as to have data-input timing that is not affected by manufacturing variation as described above, the timing of data outputs ends up being affected by manufacturing variation, resulting in a data-receiver-side semiconductor device failing to secure proper input timing. On the other hand, if a timing adjustment circuit attends to timing control such as to have data-output timing that is not affected by manufacturing variation, the timing of data inputs ends up being affected by manufacturing variation, resulting in a failure to secure proper input timing.

Accordingly, there is a need for a timing adjustment circuit that can achieve proper operating timing with respect to both the data input and the data output regardless of manufacturing variation.

SUMMARY OF THE INVENTION

It is a general object of the present invention to provide a timing adjustment circuit that substantially obviates one or more problems caused by the limitations of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a timing adjustment circuit particularly pointed out in the specification in such full, clear, concise, and exact terms as to enable a person having ordinary skill in the art to practice the invention.

To achieve these and other advantages in accordance with the purpose of the invention, the invention provides a circuit for timing adjustment, which includes a PLL circuit configured to generate a phase-adjusted clock signal in response to phase comparison between an input clock signal and a delayed clock signal, a feedback path configured to delay the phase-adjusted clock signal for provision as the delayed clock signal to the PLL circuit, a first timing correction circuit configured to add a predetermined delay time to the feedback path, an output data circuit configured to supply output data at first timing responsive to the phase-adjusted clock signal, a second timing correction circuit configured to delay the first timing by the predetermined delay time to generate second timing different from the first timing, and an input data circuit configured to latch input data at the second timing.

According to at least one embodiment of the invention as suggested by the timing adjustment circuit described above, the first timing correction circuit having the predetermined delay time is inserted into the feedback path for phase control, and the second timing correction circuit having the same predetermined delay time is inserted into the path through which the synchronizing clock signal for the purpose of data inputting propagates. Owing to the function of the first timing correction circuit, the output data is always output at fixed timing relative to an external clock signal regardless of manufacturing variation. Owing to the function of the second timing correction circuit, further, the delay time of the first timing correction circuit is cancelled, so that the input data is always latched at fixed timing relative to the external clock signal regardless of manufacturing variation.

With this provision, it is possible to attain a stable, reliable data input/output operation without being affected by the fluctuation of delays of the data input/output circuits due to manufacturing variation.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 6:
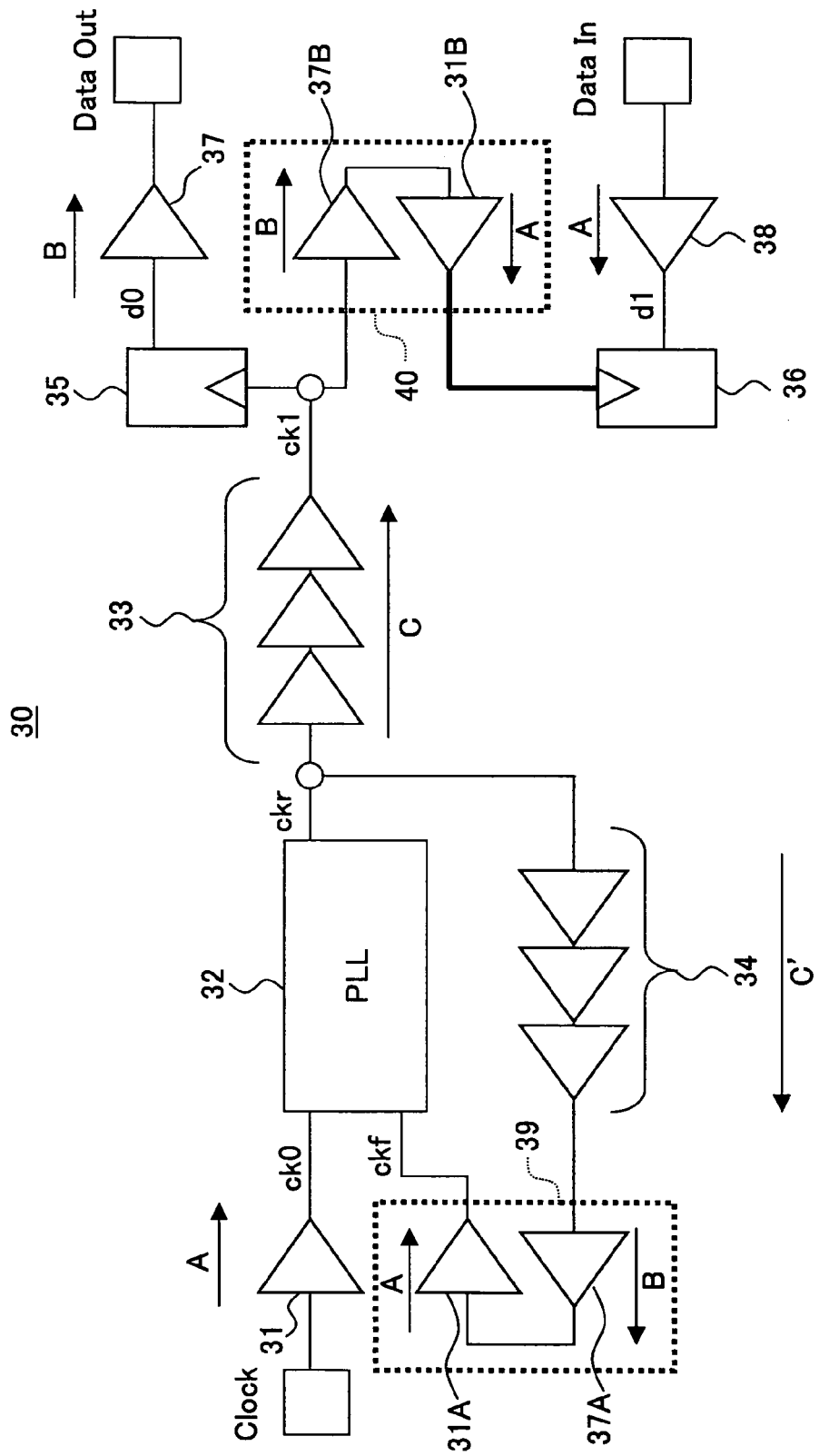
FIG. 6 is a circuit diagram showing an example of a timing adjustment circuit according to the present invention.

FIG. 6 is a circuit diagram showing an example of a timing adjustment circuit according to the present invention. A timing adjustment circuit 30 of FIG. 6 includes a clock input circuit 31, a PLL circuit 32, a clock tree 33, a feedback tree 34, an output-purpose flip-flop (output data circuit) 35, an input-purpose flip-flop (input data circuit) 36, a data output circuit 37, a data input circuit 38, a dummy input/output circuit (first timing correction circuit) 39, and an input timing correction circuit (second timing correction circuit) 40.

The clock input circuit 31 receives a clock signal Clock supplied from the exterior of the chip, and supplies the received signal to the PLL circuit 32 as an input clock signal ck0. The clock input circuit 31 has an inherent delay time A. The input clock signal ck0 has a delay equal to the delay time A relative to the clock signal Clock when supplied to the PLL circuit 32. The PLL circuit 32 adjusts the phase of the input clock signal ck0, and outputs a clock signal ckr having the adjusted phase. The clock signal ckr having the adjusted phase propagates through the clock tree 33 before it is supplied to the output-purpose flip-flop 35 as a synchronizing clock signal ck1. The synchronizing clock signal ck1 is supplied through the input timing correction circuit 40 to the input-purpose flip-flop 36 as a synchronizing clock signal ck11. The input timing correction circuit 40 includes a dummy input circuit 31B having the same delay time A as the clock input circuit 31 and a dummy output circuit 37B having the same delay time B as the data output circuit 37. The input timing correction circuit 40 thus has a total delay time equal to A+B.

The clock signal ckr having the adjusted phase is supplied to another input of the PLL circuit 32 as a delayed clock signal ckf after propagating through the feedback tree 34 having the same delay C' as the delay C of the clock tree 33 and further propagating through the dummy input/output circuit 39. The dummy input/output circuit 39 includes a dummy input circuit 31A having the same delay time A as the clock input circuit 31 and a dummy output circuit 37A having the same delay time B as the data output circuit 37. The dummy input/output circuit 39 thus has a total delay time equal to A+B. The PLL circuit 32 performs phase control such that the input clock signal ck0 and the delayed clock signal ckf have the same phase, thereby generating the clock signal ckr having the adjusted phase.

The output-purpose flip-flop 35 outputs output data d0 at edge timing of the synchronizing clock signal ck1. The output data d0 is output to the exterior of the chip as a data output signal DataOut by the data output circuit 37. The data output circuit 37 has an inherent delay time B, so that the data output signal DataOut has a delay equal to the delay time B relative to the output data d0.

The data input circuit 38 receives a data input signal DataIn supplied from the exterior of the chip, and supplies the received signal to the input-purpose flip-flop 36 as input data d1. The input-purpose flip-flop 36 latches the input data d1 at edge timing of the synchronizing clock signal ck1. The data input circuit 38 has an inherent delay time A, so that the input data d1 has a delay equal to the delay time A relative to the data input signal DataIn. The delay time of the data input circuit 38 and the delay time of the clock input circuit 31 are identical.

Figure 7:
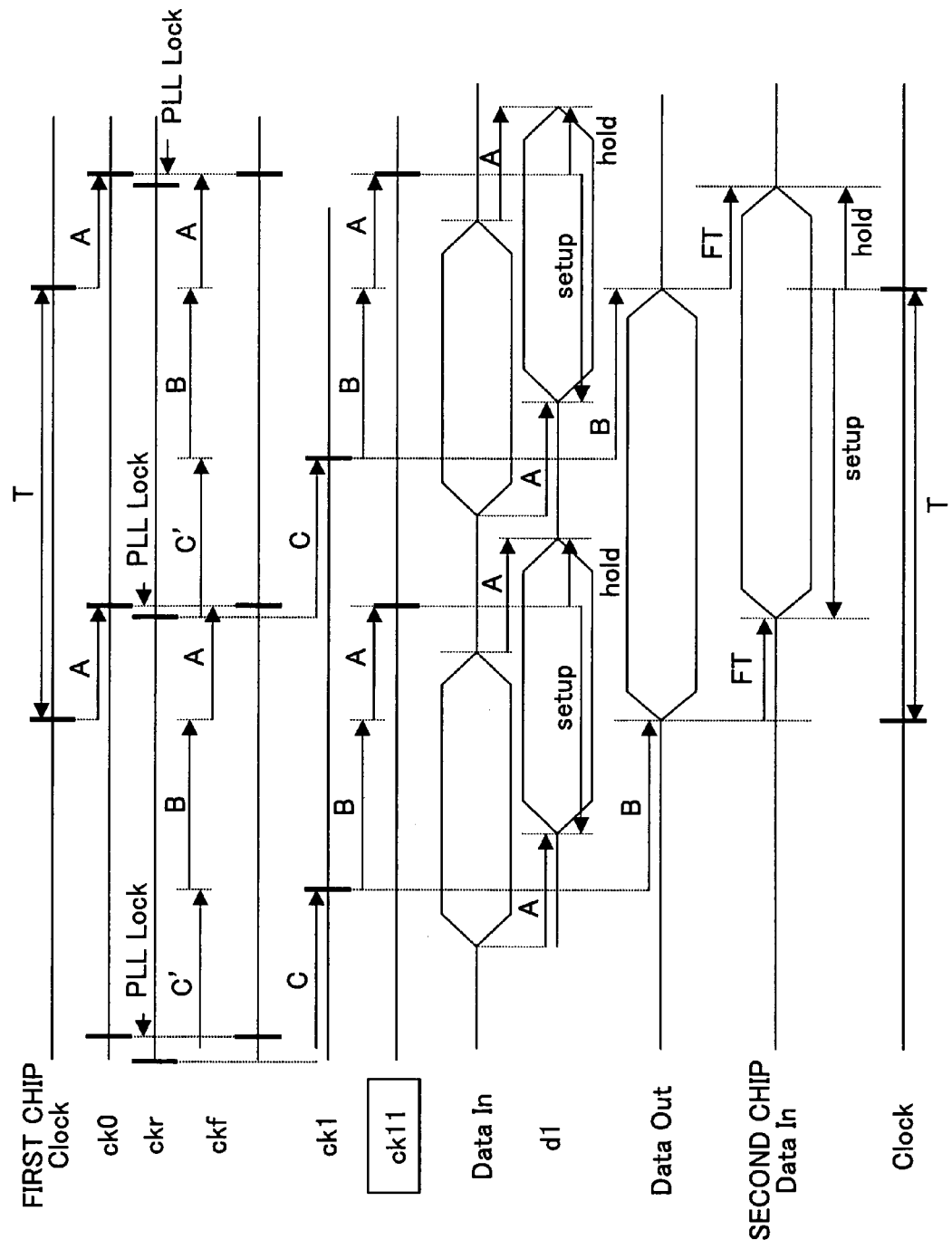
FIG. 7 is a timing chart showing the operation timing of the timing adjustment circuit shown in FIG. 6.

FIG. 7 is a timing chart showing the operation timing of the timing adjustment circuit 30 shown in FIG. 6. As shown in FIG. 7, the input clock signal ck0 is delayed by a delay equal to the delay time A relative to the clock signal Clock. The clock signal ckr having an adjusted phase is phase-adjusted such that the delayed clock signal ckf and the input clock signal ck0 have the same phase. The delayed clock signal ckf is delayed by the delay time A+B+C' relative to the clock signal ckr having the adjusted phase, and the synchronizing clock signal ck11 is delayed by the delay time A+B+C relative to the clock signal ckr having the adjusted phase. Since the delay time C' of the delayed clock signal ckf is equal to the delay time C of the synchronizing clock signal ck11, the phase of the synchronizing clock signal ck11 coincides with the phase of the delayed clock signal ckf, and also coincides with the phase of the input clock signal ck0.

The input data d1 is latched at the edge timing of the synchronizing clock signal ck11. The delay of the synchronizing clock signal ck11 relative to the clock signal Clock and the delay of the input data d1 relative to the data input signal DataIn are the same delay time A. It follows that when the data input signal DataIn is supplied in synchronization with the clock signal Clock, the setup time and hold time are fixed regardless of the length of the delay time A. In this manner, the timing adjustment circuit 30 of FIG. 6 achieves data inputting at fixed timing free from the influence of manufacturing variation.

The delayed clock signal ckf is delayed by the delay time A+B+C' relative to the clock signal ckr having the adjusted phase, and the data output signal DataOut is output with the delay C+B relative to the clock signal ckr having the adjusted phase. Accordingly, the data output signal DataOut is output a time A earlier than the delayed clock signal ckf. Since this delayed clock signal ckf is delayed by the delay time A relative to the clock signal Clock, the output timing of the data output signal DataOut is equal to the edge timing of the clock signal Clock. This timing match is maintained even if the delay times A, B, C, and/or C' fluctuate due to manufacturing variation.

This data output signal DataOut propagates from a first chip to a second chip by spending a flight time FT before receipt by the second chip as the data input signal DataIn. The timing of the data output signal DataOut is fixed relative to the clock signal Clock regardless of manufacturing variation, so that the timing of the data input signal DataIn received at the second chip is also fixed to the clock signal Clock. Accordingly, this provision makes it possible to secure a proper setup time so as to attain reliable data inputting.

In the embodiment of the present invention as described above, the dummy input/output circuit (first timing correction circuit) 39 having the delay time A+B is inserted into the feedback path for phase control, and the input timing correction circuit (second timing correction circuit) 40 having the delay time A+B is inserted into the path through which the synchronizing clock signal for the purpose of data inputting propagates. Owing to the function of the dummy input/output circuit 39, the data output signal is always output at fixed timing relative to the clock signal Clock regardless of manufacturing variation. Owing to the function of the input timing correction circuit 40, further, the delay time of the dummy input/output circuit 39 is cancelled, so that the data input signal is always latched at fixed timing relative to the clock signal Clock regardless of manufacturing variation. With this provision, it is possible to attain a stable, reliable data input/output operation without being affected by the fluctuation of delays of the data input/output circuits due to manufacturing variation.

Figure 8:
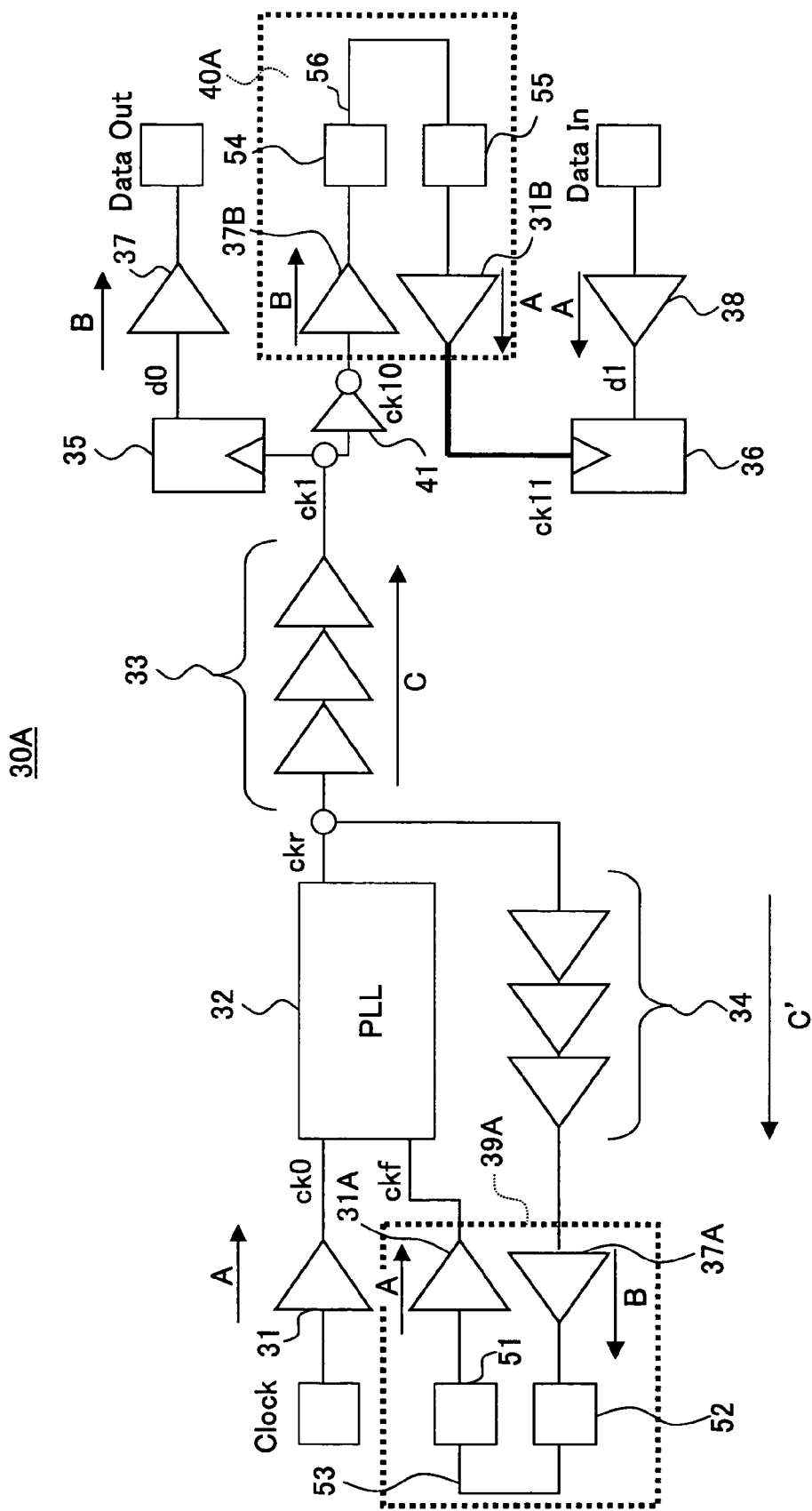
FIG. 8 is a circuit diagram showing a variation of the timing adjustment circuit according to the present invention.

FIG. 8 is a circuit diagram showing a variation of the timing adjustment circuit according to the present invention. In FIG. 8, the same elements as those of FIG. 6 are referred to by the same numerals, and a description thereof will be omitted.

In addition to the configuration of the timing adjustment circuit 30 of FIG. 6, a timing adjustment circuit 30A of FIG. 8 includes a phase compensation circuit 41, terminal pins 51 and 52, a flight-time compensation signal line 53, terminal pins 54 and 55, and a flight-time compensation signal line 56. The flight-time compensation signal lines 53 and 56 may be provided outside the chip when the chip is implemented on a printed circuit board as shown FIG. 1. Accordingly, the flight-time compensation signal lines 53 and 56 may not be an essential element of the timing adjustment circuit of the present invention in a sense that they are not provided as part of an individual chip having the timing adjustment circuit of the present invention.

The dummy input/output circuit 39A provides a delay time equal to A+B+FT by including the terminal pins 51 and 52 and the flight-time compensation signal line 53. The flight-time compensation signal line 53 may be configured such that it extends from the terminal pin 52 toward the chip on the other end that receives the data output signal DataOut, and takes a turn halfway through the path to return to the terminal pin 51.

The input timing correction circuit 40A provides a delay time equal to A+B+FT by including the terminal pins 54 and 55 and the flight-time compensation signal line 56. The flight-time compensation signal line 56 may be configured such that it extends from the terminal pin 54 toward the chip on the other end that receives the data output signal DataOut, and takes a turn halfway through the path to return to the terminal pin 55.

In the example of FIG. 8, the phase compensation circuit 41 is an inverter, and provides a 180-degree phase delay by inverting the synchronizing clock signal ck1. This makes it easier to set the timing of latching of the input data d1 approximately to a midpoint of its data valid period. When data is latched approximately at the midpoint of its data valid period, generally, an optimum setup time and data hold time are achieved.

Figure 9:
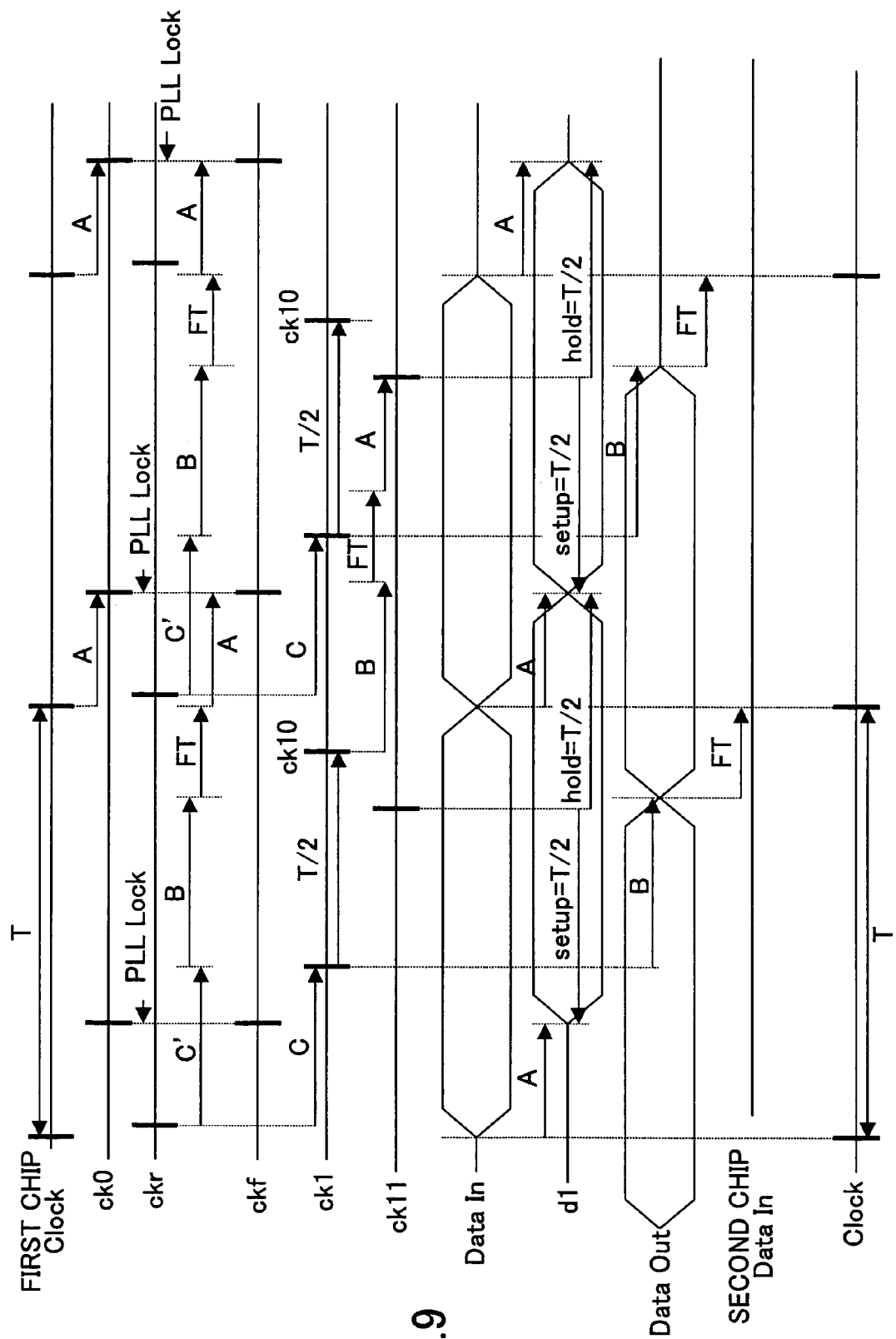
FIG. 9 is a timing chart showing the operation timing of the timing adjustment circuit of FIG. 8.

FIG. 9 is a timing chart showing the operation timing of the timing adjustment circuit 30 of FIG. 8. As shown in FIG. 9, there is a time difference equal to A+B+C'+FT between the clock signal ckr having the adjusted phase and the delayed clock signals ckf. It follows that a time difference equal to B+C'+FT exists between the clock signal ckr having the adjusted phase and the clock signal Clock. The data output signal DataOut is output after the delay time C+B following the clock signal ckr having the adjusted phase. Since C and C' are equal, the output timing of the data output signal DataOut is positioned a time FT before the edge timing of the clock signal Clock. When the data output signal DataOut propagates from the first chip to the second chip by spending the flight time FT, therefore, the timing of the data input signal DataIn received by the second chip is aligned with the edge timing of the clock signal Clock.

Further, the clock signal ckr having the adjusted phase is delayed by the time C to become the synchronizing clock signal ck1. This synchronizing clock signal ck1 is further delayed by T/2 through signal inversion to become the synchronizing clock signal ck10. Here, T is the cycle of the clock signal Clock. The synchronizing clock signal ck10 is delayed by the delay time A+B+FT by the input timing correction circuit 40A to become the synchronizing clock signal ck11. As a result, the synchronizing clock signal ck11 has the edge timing that is delayed by the time A+T/2 relative to the clock signal Clock. At the edge timing of the synchronizing clock signal ck11, the input data d1 having a delay equal to the time A relative to the data input signal DataIn is latched. This cancels the time A, and makes it possible to latch the data at the midpoint of its data valid period because of the time difference T/2. Here, it is assumed that the data input signal DataIn is supplied in synchronization with the edges of the clock signal Clock.

Figure 10:
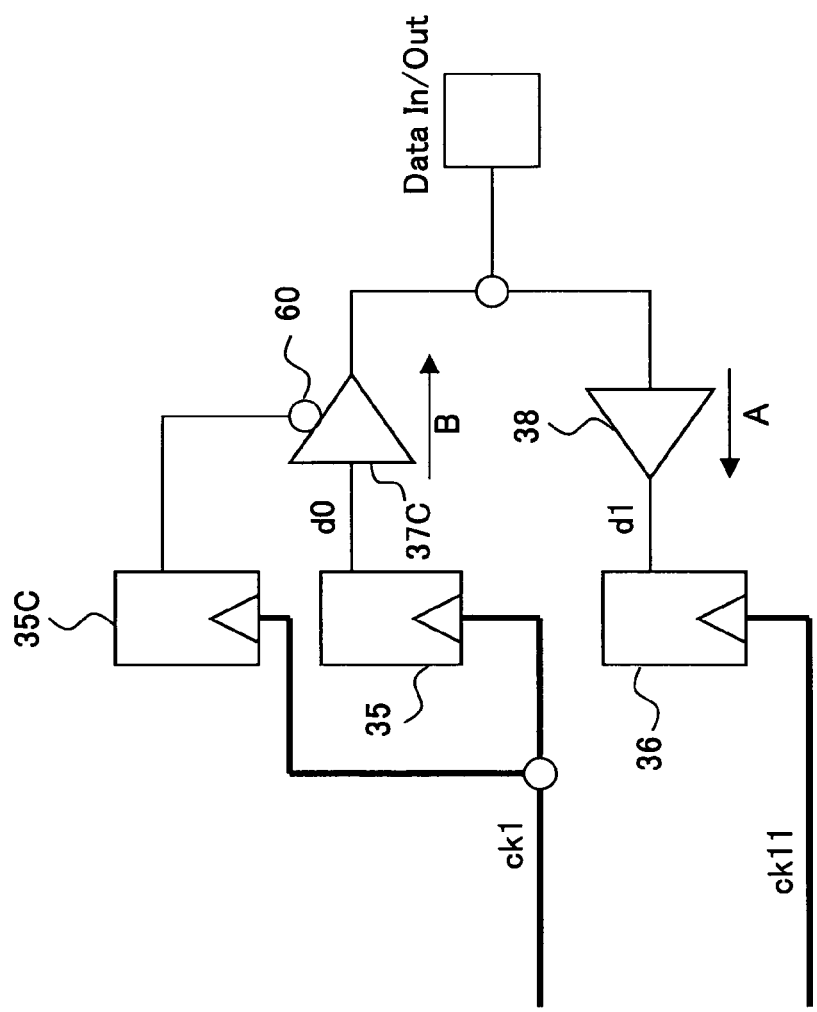
FIG. 10 is a circuit diagram showing a configuration in which a single terminal pin is used as both a data input terminal and a data output terminal.

FIG. 10 is a circuit diagram showing a configuration in which a single terminal pin is used as both a data input terminal and a data output terminal. In FIG. 10, the same elements as those of FIG. 6 and so on are referred to by the same numerals, and a description thereof will be omitted.

As shown in FIG. 10, when the same pin is used as a data input terminal and also as a data output terminal, there is a need to use a data output circuit 37C that can set its output in a HIGH impedance state. The control of an input into a control node 60 provides for the output of the data output circuit 37C to be switched between the HIGH impedance state and the state in which the output data level is either HIGH or LOW. In this case, a flip-flop 35C having the same configuration as the output-purpose flip-flop 35 is provided, and is allowed to operate in synchronization with the synchronizing clock signal ck1, with the output of the flip-flop 35C being supplied as the control signal to the control node 60. This makes it possible to synchronize the timing of the control signal input into the control terminal 60 with the timing of a data input/output signal.

Figure 11:
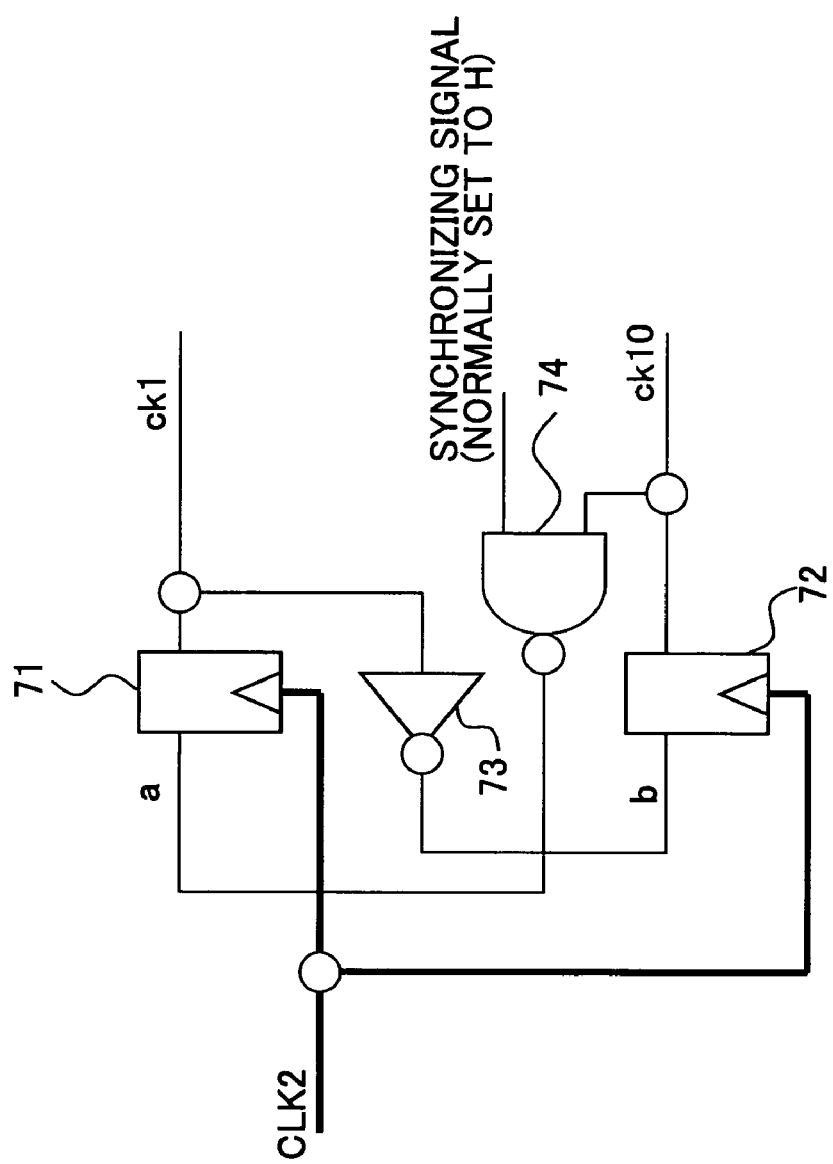
FIG. 11 is a circuit diagram showing an example of the construction of a phase compensation circuit.

FIG. 11 is a circuit diagram showing an example of the construction of the phase compensation circuit 41. The example shown in FIG. 8 uses the phase compensation circuit 41 that is an inverter. Since an inverter has a small inherent delay, a phase delay exactly equal to 180 degrees cannot be achieved. The phase compensation circuit 41 of FIG. 11 is an example of a circuit that can provide a phase delay exactly equal to 180 degrees.

The phase compensation circuit 41 of FIG. 11 includes flip-flops 71 and 72, an inverter 73, and a NAND gate 74. The flip-flops 71 and 72 receive a clock signal CLK2 having double the frequency from the PLL circuit 32 (see FIG. 6), and operates in synchronization with the edge timing of this clock signal. Accordingly, the synchronizing clock signal ck1 output from the flip-flop 71 has the edge timing that is completely aligned with the edge timing of the synchronizing clock signal ck10 output from the flip-flop 72. The synchronizing clock signal ck1 is inverted by the inverter 73 for provision to the input of the flip-flop 72. The synchronizing clock signal ck10 is inverted by the NAND gate 74 for provision to the input of the flip-flop 71. A synchronizing signal supplied to the NAND gate 74 is generally HIGH, so that the NAND gate 74 operates as an inverter.

Figure 12:
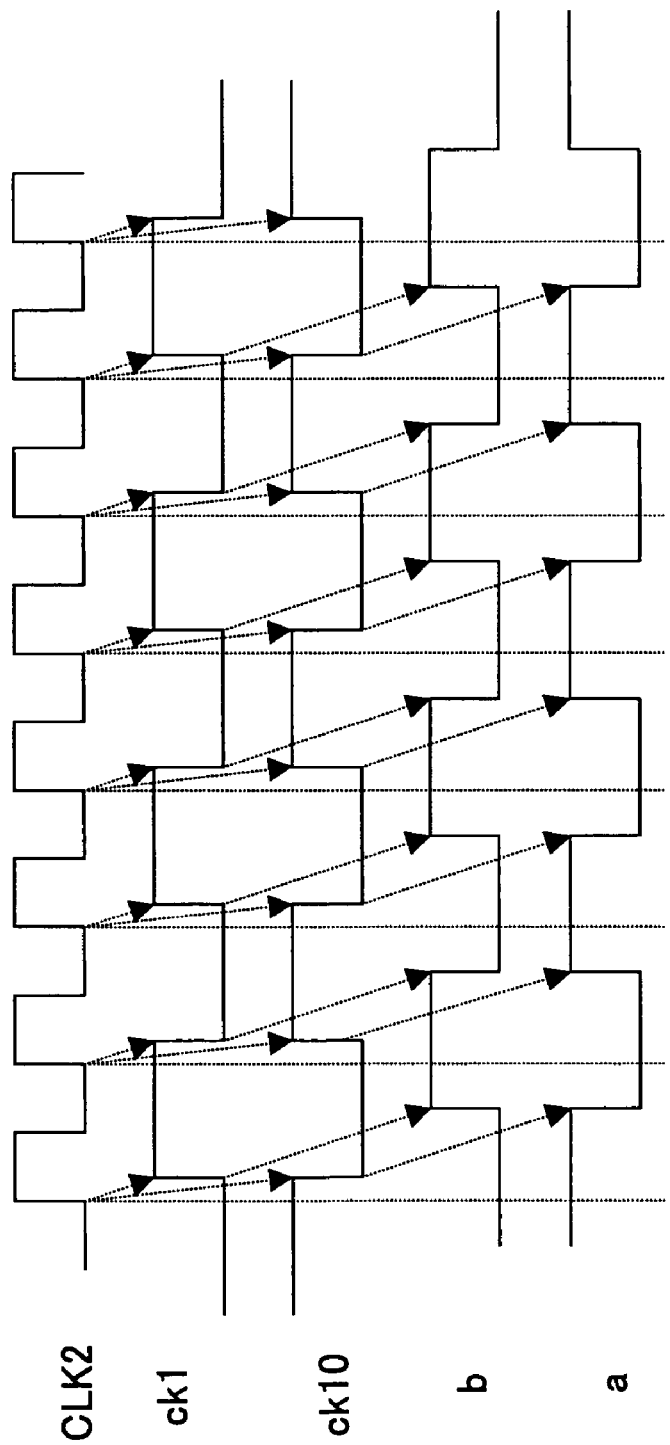
FIG. 12 is a timing chart for explaining the operation of the phase compensation circuit of FIG. 11.

FIG. 12 is a timing chart for explaining the operation of the phase compensation circuit 41 of FIG. 11. As shown in FIG. 12, the synchronizing clock signal ck1 in synchronization with the edge timing of the clock signal CLK2 is inverted to become a signal b. The signal b synchronizes with the edge timing of the clock signal CLK2 so as to become the synchronizing clock signal ck10. Further, the synchronizing clock signal ck10 in synchronization with the edge timing of the clock signal CLK2 is inverted to become a signal a. The signal a synchronizes with the edge timing of the clock signal CLK2 so as to become the synchronizing clock signal ck1.

Through the operation described above, the synchronizing clock signal ck10 is given a phase that differs by 180 degrees from the phase of the synchronizing clock signal ck1.

Figure 13:
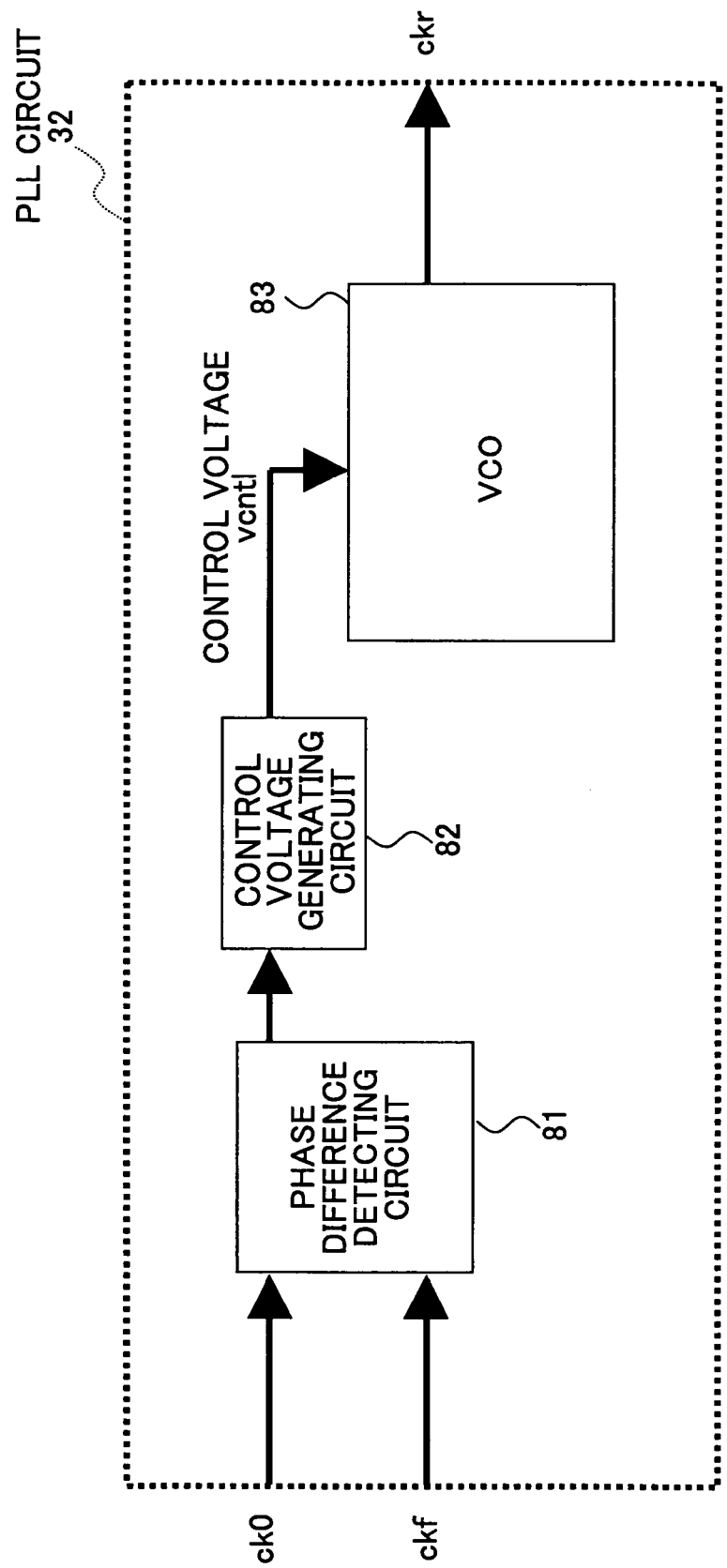
FIG. 13 is a circuit diagram showing an example of the construction of a PLL circuit.

FIG. 13 is a circuit diagram showing an example of the construction of the PLL circuit 32. The PLL circuit 32 of FIG. 13 includes a phase difference detecting circuit 81, a control voltage generating circuit 82, a VCO (voltage control oscillator) 83. The phase difference detecting circuit 81 serves to detect a phase difference between the input clock signal ck0 and the delayed clock signal ckf. Specifically, the phase difference detecting circuit 81 controls the control voltage generating circuit 82 to lower the oscillating frequency of the VCO 83 when the phase of the delayed clock signal ckf is earlier than the phase of the input clock signal ck0. The phase difference detecting circuit 81 controls the control voltage generating circuit 82 to raise the oscillating frequency of the VCO 83 when the phase of the delayed clock signal ckf is later than the phase of the input clock signal ck0. The phase difference detecting circuit 81 controls the control voltage generating circuit 82 to maintain the current oscillating frequency of the VCO 83 when the phase of the delayed clock signal ckf is the same as the phase of the input clock signal ck0.

Based on the output of the phase difference detecting circuit 81, the control voltage generating circuit 82 generates a control voltage vcntl, which controls the oscillating frequency of the VCO 83. The VCO 83 adjusts the frequency of the clock signal ckr having an adjusted phase based on the voltage level of the control voltage vcntl.

Figure 14:
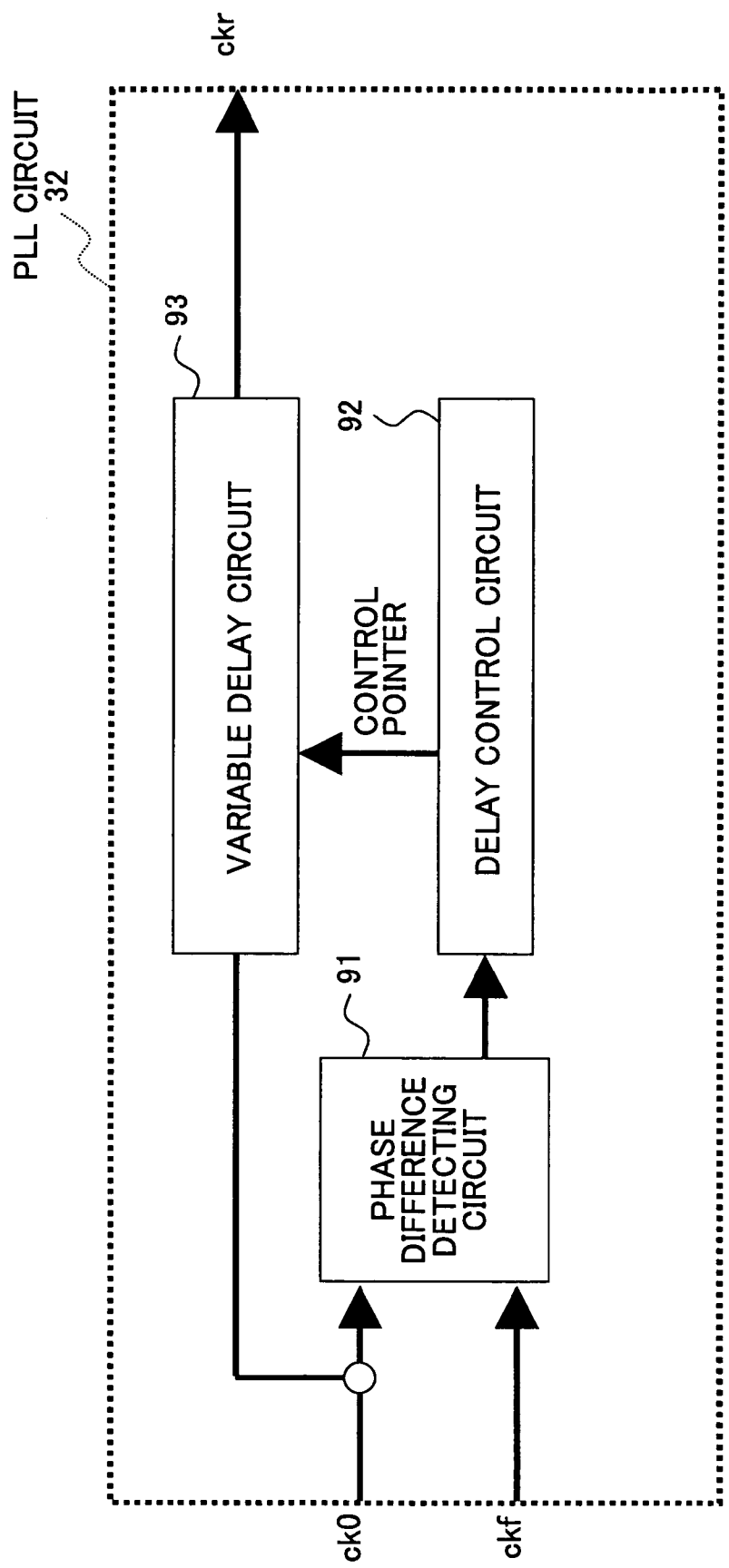
FIG. 14 is a circuit diagram showing another example of the construction of the PLL circuit.

FIG. 14 is a circuit diagram showing another example of the construction of the PLL circuit 32. The circuit construction shown in FIG. 14 is generally referred to as a DLL (delay locked loop), which is one type of PLL circuit in a broad sense. The PLL circuit 32 of FIG. 14 includes a phase difference detecting circuit 91, a delay control circuit 92, and a variable delay circuit 93. The phase difference detecting circuit 91 serves to detect a phase difference between the input clock signal ck0 and the delayed clock signal ckf. Specifically, when the phase of the delayed clock signal ckf is earlier than the phase of the input clock signal ck0, the delay control circuit 92 is controlled to increase the delay time of the variable delay circuit 93. When the phase of the delayed clock signal ckf is later than the phase of the input clock signal ck0, the delay control circuit 92 is controlled to shorten the delay time of the variable delay circuit 93. Furthermore, when the phase of the delayed clock signal ckf is the same as the phase of the input clock signal ck0, the delay control circuit 92 is controlled to maintain the current delay of the variable delay circuit 93. Based on the output of the phase difference detecting circuit 91, the delay control circuit 92 generates a control pointer, which controls the delay time of the variable delay circuit 93. The variable delay circuit 93 adjusts the delay time of the clock signal ckr having an adjusted phase based on the value of the control pointer.

While the PLL circuit 32 (DLL circuit) of FIG. 14 adjusts only the delay time, the PLL circuit 32 of FIG. 13 adjusts the oscillating frequency to achieve phase adjustment. The PLL circuit 32 of FIG. 13 has an advantage in that the provision of a frequency divider at the output of the VCO 83 makes it possible to generate a frequency that is a multiple of the base frequency at the output of the VCO 83. Such multiplied-frequency signal may be used as the clock signal CLK2 shown in FIG. 11 and FIG. 12, for example.

In the following, another aspect of the present invention will be described.

This aspect of the invention generally relates to memory controllers, and particularly relates to a memory controller that controls a memory of the DDRSDRAM type.

"DDRSDRAM" (double data rate synchronous dynamic random access memory) is the term used to refer to a memory that transfers data at double the rate of a clock signal among the family of synchronous DRAMs that input/output signals in synchronization with a clock signal. Specifically, data is input/output at both the positive edge and negative edge of a clock signal, thereby achieving a data transfer rate that is double the clock frequency.

From the memory controller to a DDRSDRAM, a differential clock comprised of a clock signal CLK and an inverted clock signal /CLK is supplied. Commands (i.e., address and control signals) are supplied from the memory controller to the memory at positive edges of the clock signal CLK. Data transfer between the memory controller and the memory is performed in synchronization with a two-way data strobe signal DQS. The data strobe signal DQS is output simultaneously with data by the device at the data transmission side. During the write operation, the memory controller supplies the data strobe signal DQS. During the read operation, the memory transmits the data strobe signal DQS. Access to the memory is performed in the form of burst operation, in which the reading of data starts at a specified position, and the specified number of data are continuously read in the specified order.

The related-art technology includes a technology that latches a DDR signal by dividing it in parallel by use of a DS with a first delay, and further latches the DDR signal by use of a signal with a second delay, for provision to the core circuit in synchronization with CLK (Japanese Patent Application Publication No. 2003-151271).

Figure 15:
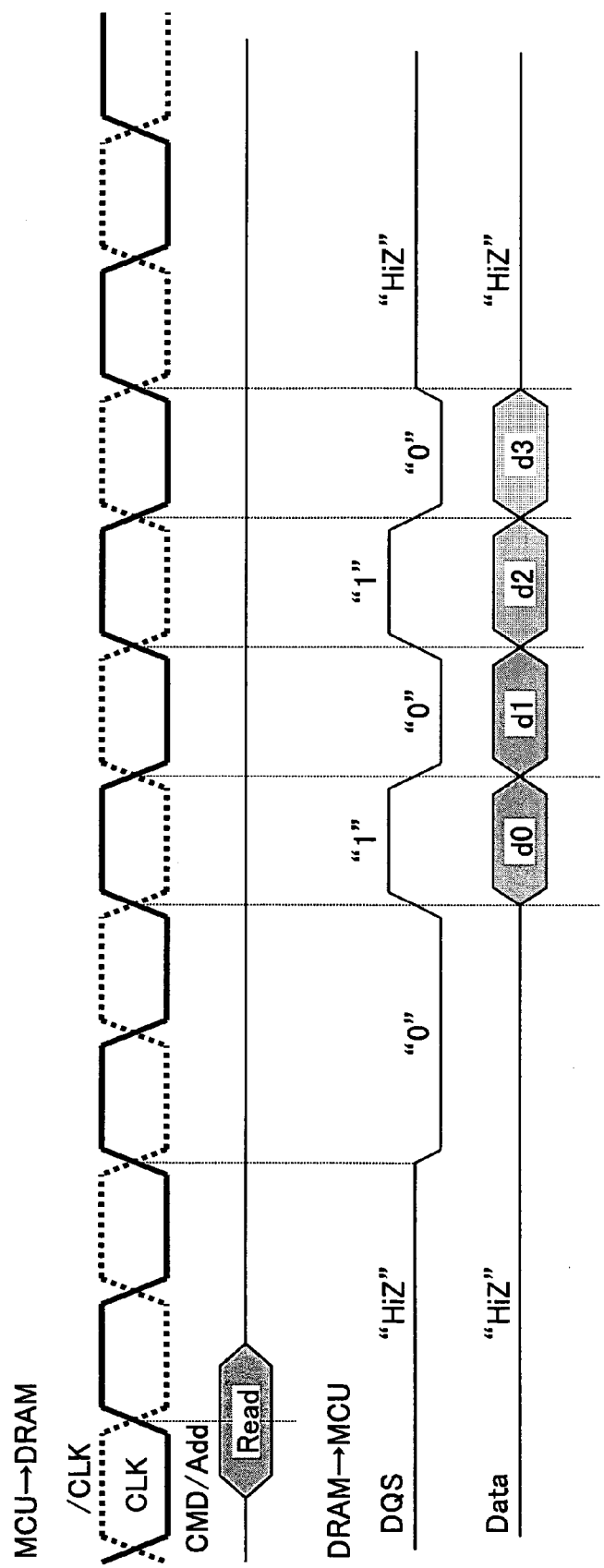
FIG. 15 is a timing chart illustrating the read specification of a DDRSDRAM.

FIG. 15 is a timing chart illustrating the read specification of the DDRSDRAM. As shown in FIG. 15, a read command Read is input into a memory device from the memory controller in synchronization with a rising edge of a clock signal CLK supplied to the memory device. Although not illustrated, an address signal is input into the memory at the same time as the read command Read.

Figure 1:
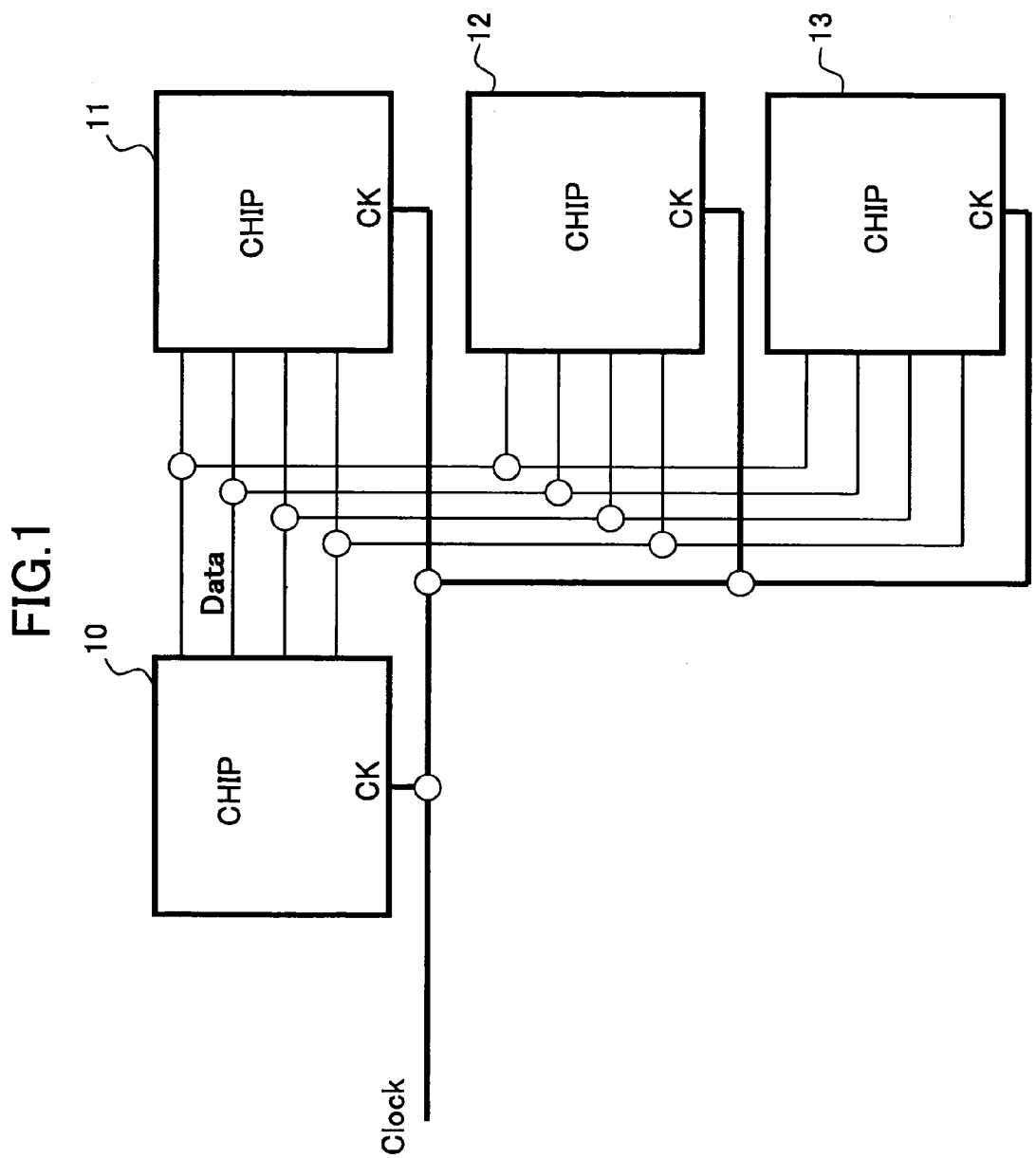
FIG. 1 is an illustrative drawing showing an example of a construction in which semiconductor chips of the clock synchronous type are connected to each other.
Figure 2:
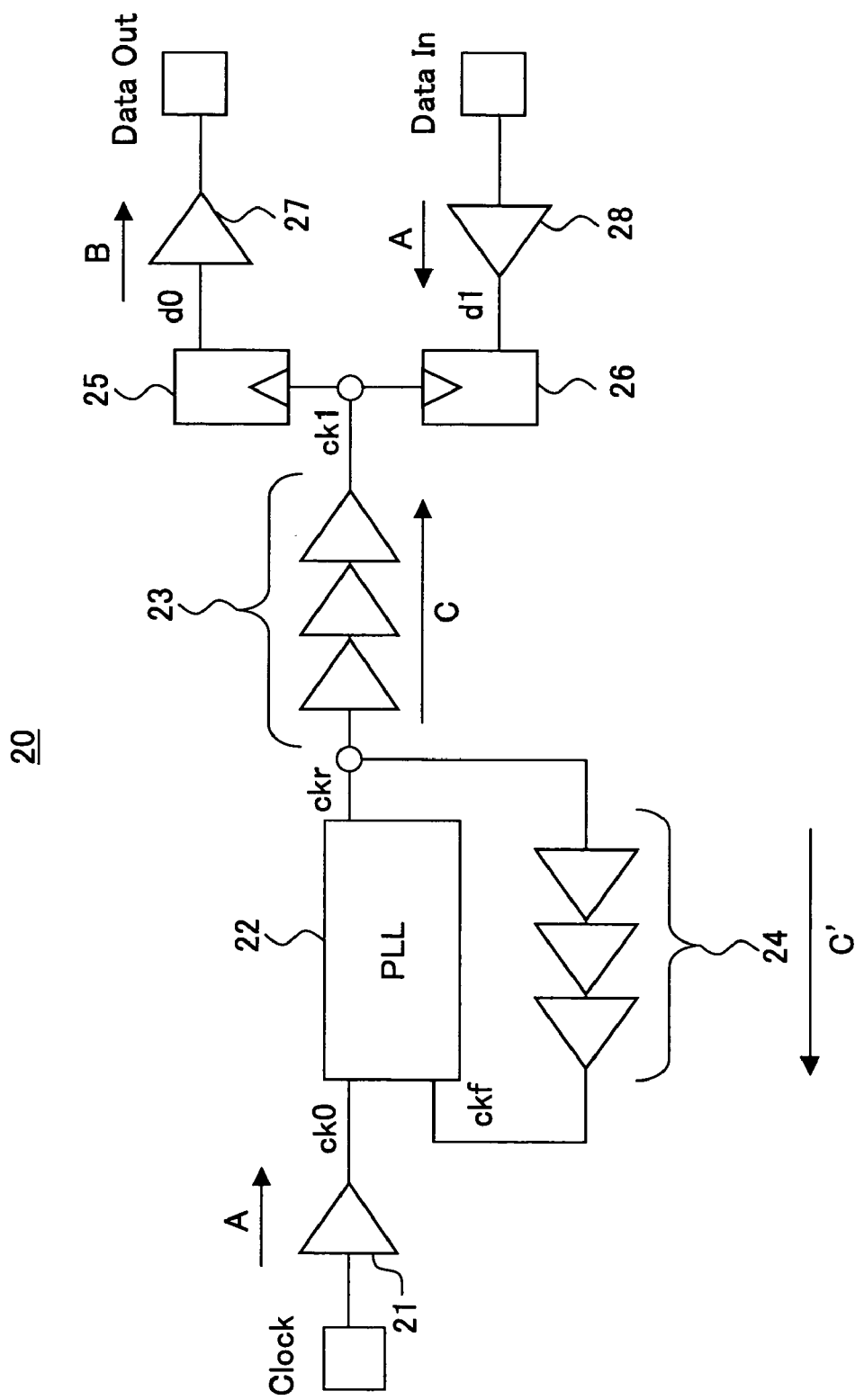
FIG. 2 is a circuit diagram showing an example of a timing adjustment circuit that corrects the timing of an input/output interface of the clock synchronous type.
Figure 3:
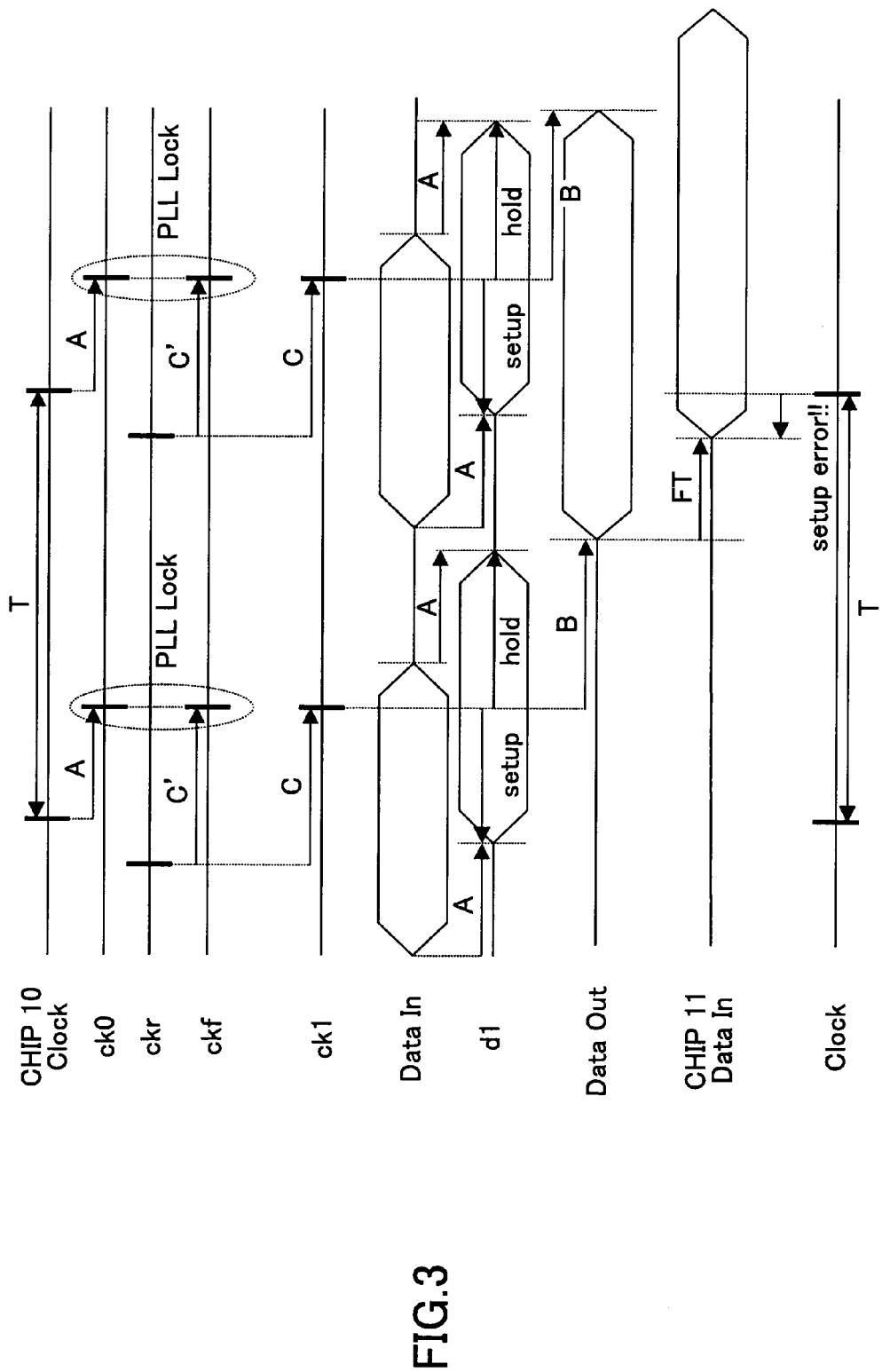
FIG. 3 is a timing chart showing the operation timing of the timing adjustment circuit shown in FIG. 2.
Figure 4:
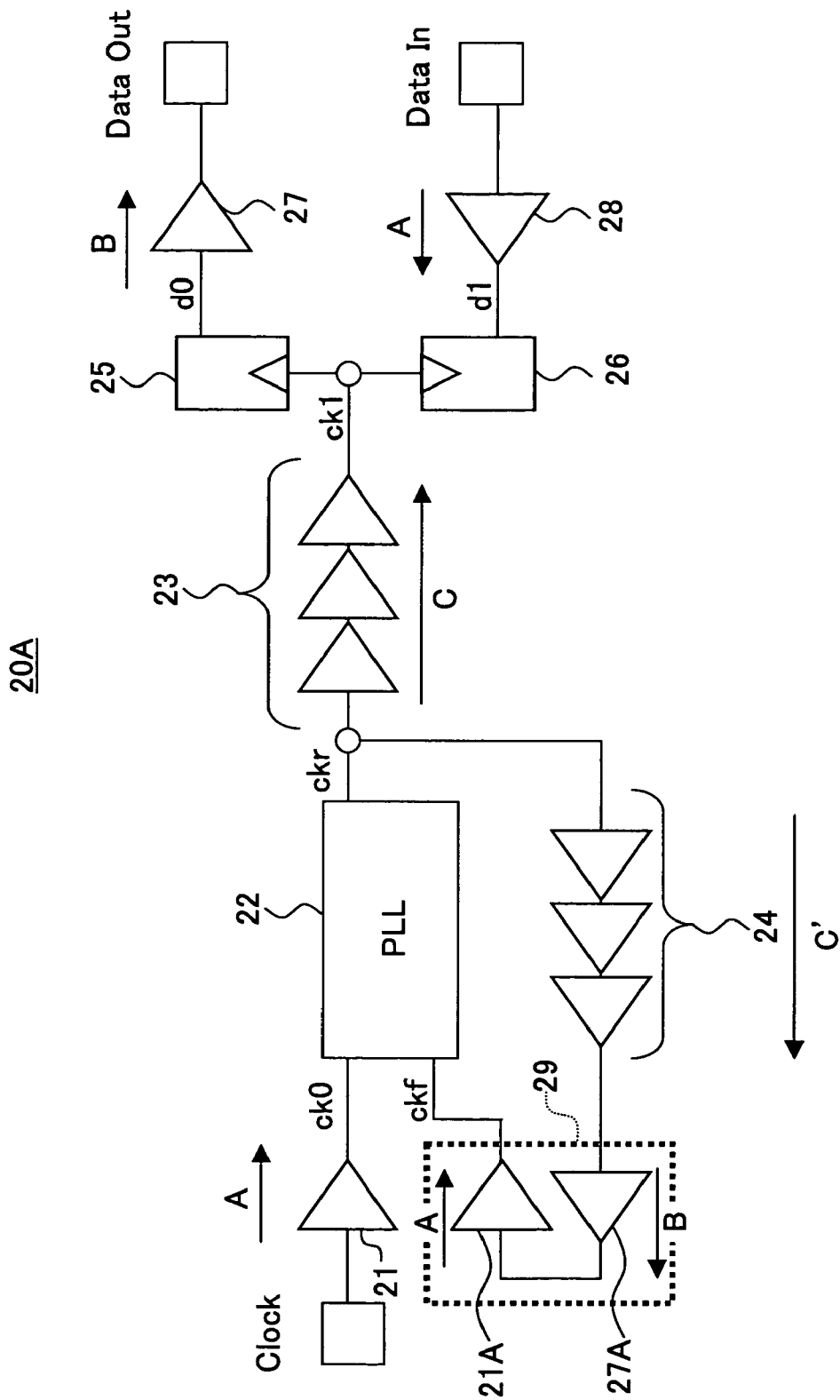
FIG. 4 is a circuit diagram showing another example of the timing adjustment circuit that corrects the timing of an input/output interface of the clock synchronous type.
Figure 5:
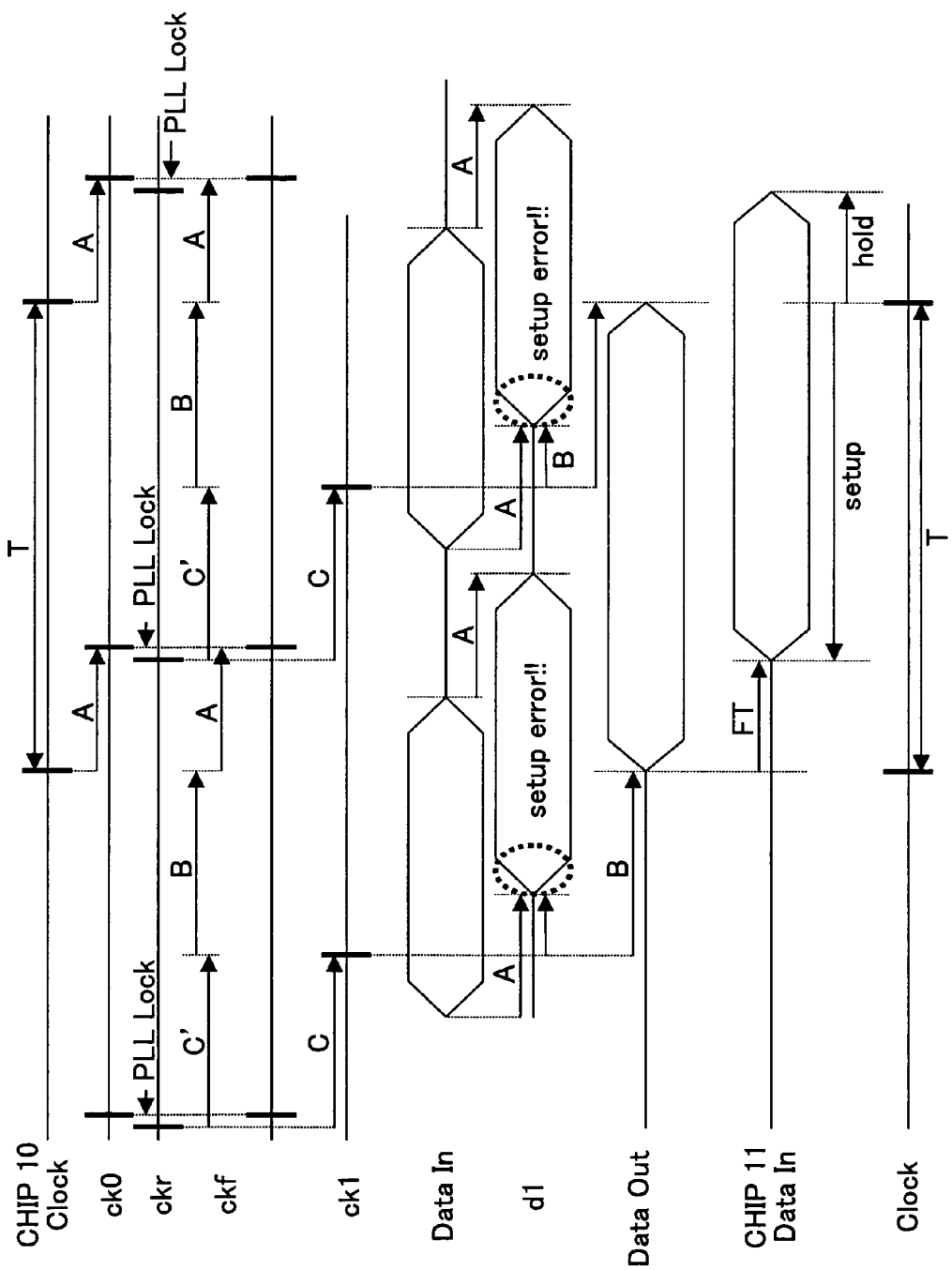
FIG. 5 is a timing chart showing the operation timing of the timing adjustment circuit of FIG. 4.

In response to the read command Read, the memory device transmits a data strobe signal DQS, and outputs data d0 through d3 continuously in synchronization with the data strobe signal DQS. Since the double-data-rate specification is assumed, the data d0 through d3 are output at the rate equal to one data output per half the cycle of the data strobe signal DQS. What is shown in FIG. 1 corresponds to the case in which the burst length is 4, and the CAS latency (i.e., the latency from the inputting of a read command Read to the outputting of the first read data) is 2 cycles.

Figure 16:
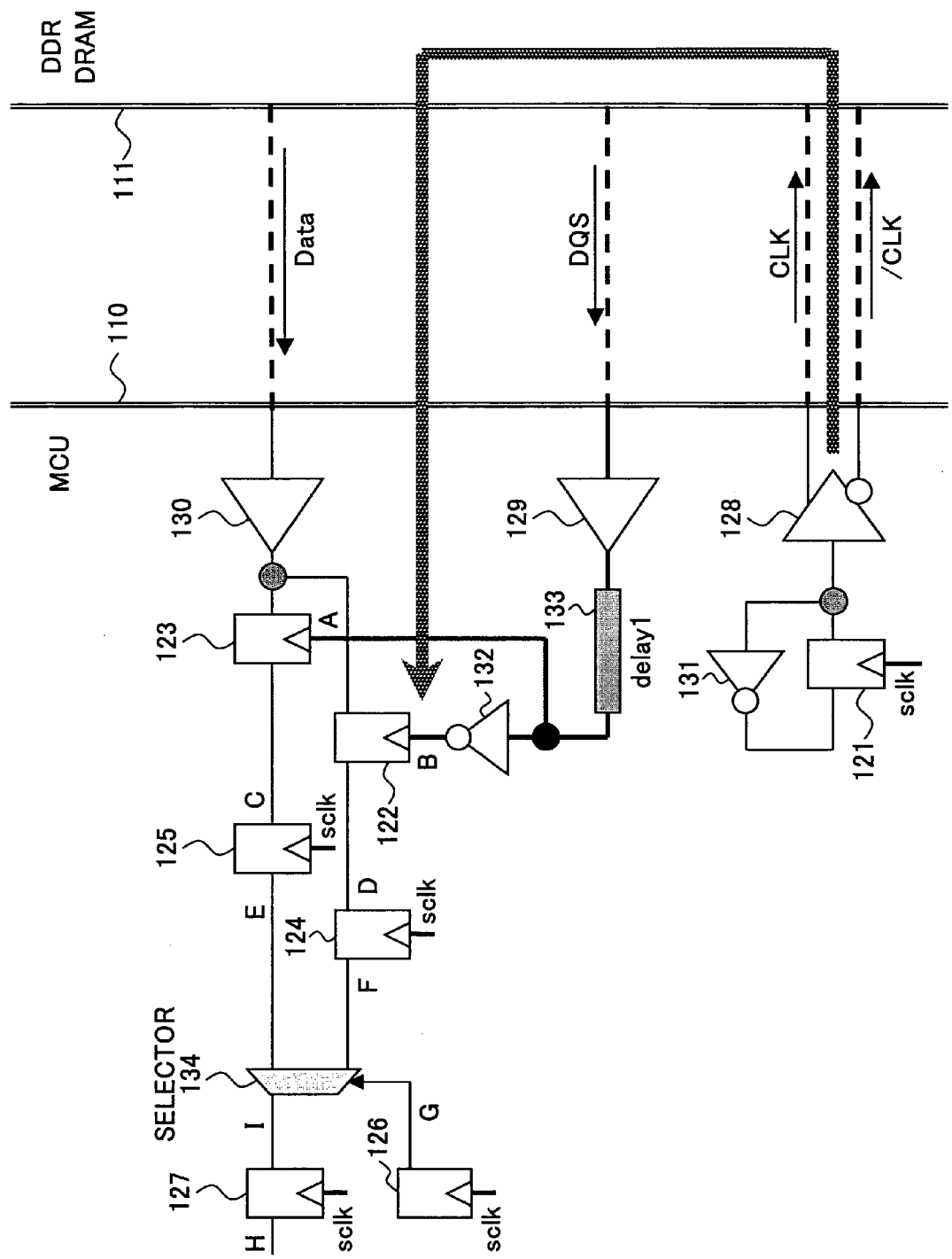
FIG. 16 is a circuit diagram showing an example of the related-art construction of a read data latching circuit provided on the memory controller side.

FIG. 16 is a circuit diagram showing an example of the related-art construction of a read data latching circuit provided on the memory controller side. Between a memory controller (MCU) 110 and a memory (DDRDRAM) 111, signal lines for coupling are provided on a printed circuit board, allowing the exchange of a data signal Data, the data strobe signal DQS, clock signals CLK and /CLK, etc.

A clock signal output circuit unit and read data latching circuit unit of the memory controller 110 includes flip-flops 121 through 127, an output buffer 128, input buffers 129 and 130, inverters 131 and 132, a delay circuit 133, and a selector 134. Among these, the flip-flop 121, the inverter 131, and the output buffer 128 together constitute the clock signal output circuit unit.

Figure 17:
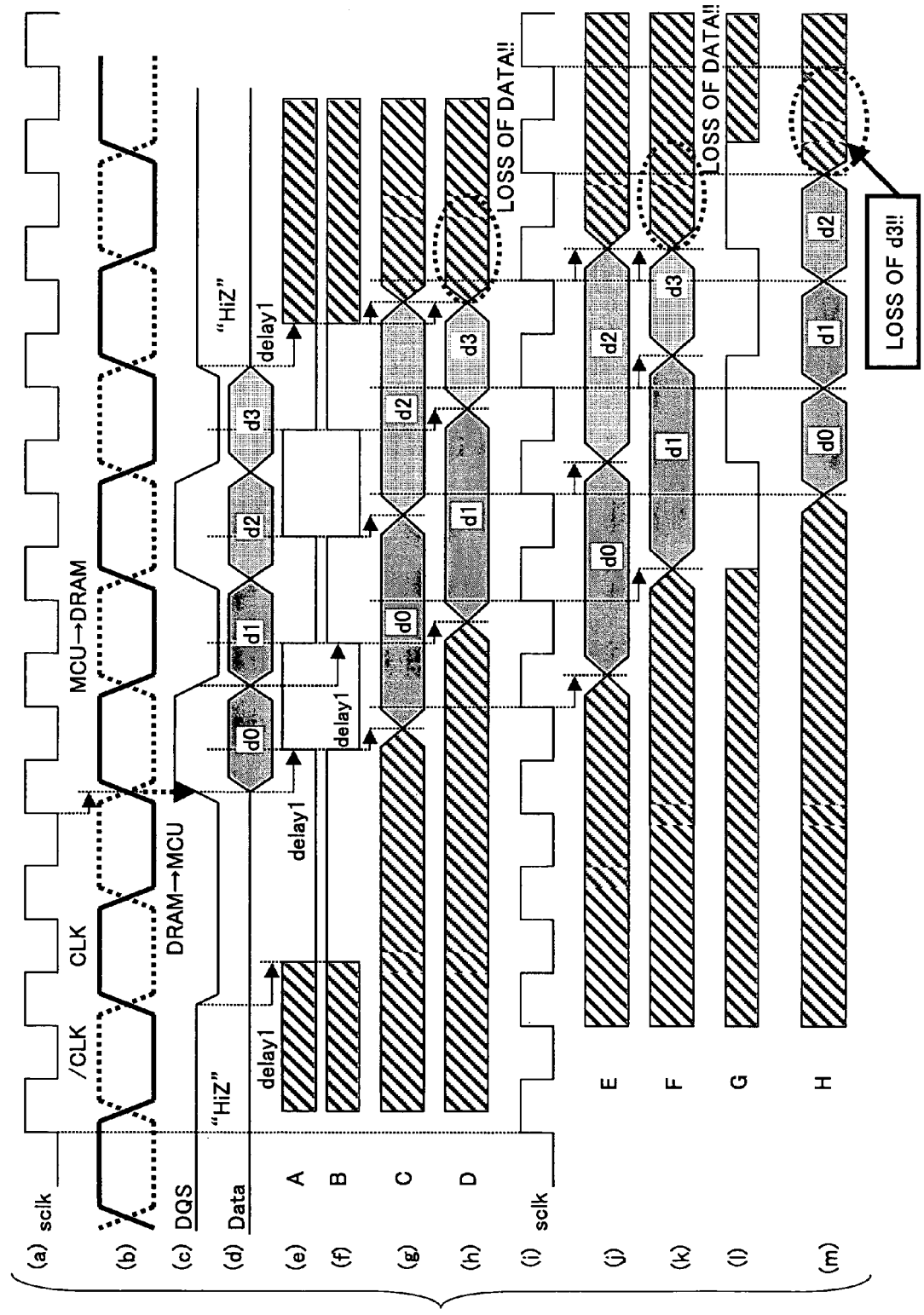
FIG. 17 is a timing chart for explaining the operation of the circuit shown in FIG. 16.

FIG. 17 is a timing chart for explaining the operation of the circuit shown in FIG. 16. In the following, the latching of read data will be described with reference to FIG. 16 and FIG. 17.

In FIG. 16, the flip-flop 121 latches an inversion of its own output signal by responding to a trigger that is a rising edge of a system clock sclk, thereby generating a clock signal having double the cycle of the system clock sclk. Based on this clock signal, the output buffer 128 supplies the clock signal CLK and the inverted clock signal /CLK to the memory 111. The memory 111 reads data from the memory core circuit in synchronization with the clock signal CLK and the inverted clock signal /CLK, and outputs the data signal Data together with the data strobe signal DQS. What is described here is shown in FIG. 17-(a) to FIG. 17-(d). The data signal Data is in synchronization with the data strobe signal DQS, and the four data items d0 through d3 are output in the form of burst operation.

In FIG. 16, the input buffer 129 of the memory controller 110 receives the data strobe signal DQS output from the memory 111. The received data strobe signal DQS is supplied from the input buffer 129 to the flip-flop 123 as a signal A through the delay circuit 133, and is also supplied from the input buffer 129 to the flip-flop 122 as a signal B through the delay circuit 133 and the inverter 132. The signals A and B are shown in FIGS. 17-(e) and (f).

The input buffer 130 of the memory controller 110 receives the data signal Data transmitted from the memory 111. The received data signal Data is latched by the flip-flop 123 at a positive transition of the signal A, and is latched by the flip-flop 122 at a positive transition of the signal B. A signal C latched by the flip-flop 123 is shown in (g) of FIG. 17, and a signal D latched by the flip-flop 122 is shown in (h) of FIG. 17.

In this manner, data latching at a double rate (i.e., double the rate of the clock signal CLK) is achieved. It should be noted here that the data strobe signal DQS and the data signal Data are in synchronization, having edges aligned with each other. The delay circuit 133 is provided for the purpose of delaying the received data strobe signal DQS to generate proper timing for latching the received data signal. The delay circuit 133 has a delay equal to delay1.

The flip-flops 125 and 124 of FIG. 16 latch the signal C and signal D, respectively, in synchronization with the positive transitions of the system clock sclk, thereby outputting a signal E and signal F, respectively. With this provision, the latched data are synchronized with the system clock sclk of the control circuit. The signal E and signal F synchronized with the system clock sclk are shown in (j) and (k) of FIG. 17.

The selector 134 of FIG. 16 receives a clock signal G made by dividing the frequency of the system clock sclk by half by the flip-flop 126, and selects the signal E and the signal F alternately in synchronization with the clock signal G, thereby outputting a signal I. Specifically, the signal E is selected and output when the signal G is LOW, and the signal F is selected and output when the signal G is HIGH. The flip-flop 127 latches the signal I in synchronization with the system clock sclk, thereby outputting a data signal H that is synchronized with the system clock sclk. The selector control signal G is shown in (l) of FIG. 17, and the data signal H is shown in (m) of FIG. 17.

In (m) of FIG. 17, the data signal H synchronized with the system clock sclk does not include the last read data item d3. This is attributable to the malfunction as will be described in the following.

As shown in (c) of FIG. 17, the data strobe signal DQS alternates between HIGH and LOW in synchronization with the data signal d0 through d3, and is set in a HIGH impedance state ("HiZ": floating state) immediately after the end of the data signal d3. This is a signal change conforming to the DDRSDRAM specification. When the data strobe signal DQS is set in the floating state, the output of the input buffer 129 becomes unstable, alternating irregularly between HIGH and LOW. As a result, the data stored in the flip-flops 122 and 123 ends up being destroyed. That is, as shown in (h) of FIG. 17, the output signal D of the flip-flop 122 is put into an unstable state in response to the change of the data strobe signal DQS to the HIGH impedance state, resulting in the stored second data d3 being destroyed.

The data signal d3 is destroyed at the same timing at which the data d2 stored in the flip-flop 123 shown in (g) of FIG. 17 disappears. Consequently, the data signal d2 is maintained for the duration of one cycle of the clock signal CLK, but the data signal d3 is maintained for only half the cycle of the clock signal CLK.

When the data signal is selected by the selector 134 and then latched by the flip-flop 127 in synchronization with the system clock sclk, therefore, the selecting and latching of signals fail with respect to the data signal d3. As a result, the data signal d3 disappears in the data signal H synchronized with the system clock sclk shown in (m) of FIG. 17.

The operation shown in FIG. 17 illustrates the designed timing conditions in which the latching of the data signal d3 is designed to fail. However, it is not intended to indicate that the latching of the data signal d3 is impossible. With proper setting of the delay time of the delay circuit 133, it is possible to design timing conditions in which the data signal d3 is satisfactorily latched. In such a case, however, little margins are provided for the delay time of the delay circuit 133 and for other operations. This results in inconvenience due to the lack of flexibility with respect to the setting of operating conditions, and gives rise to a problem in that malfunction may occur when the operating conditions change.

Accordingly, there is a need for a memory controller conforming to the DDRSDRAM specification that has a sufficient operating margin, and that is not affected by the unstable signal state caused by the HIGH impedance state of a data strobe signal.

According to the present invention, a memory controller includes a delay circuit coupled to a node for receiving a data strobe signal to output a first timing signal made by delaying the data strobe signal, a first flip-flop coupled to an output of the delay circuit and to a node for receiving a data signal to latch the data signal in response to the first timing signal, a signal-settled-state holding circuit coupled to the output of the delay circuit to output a second timing signal made from the first timing signal, and a second flip-flop coupled to an output of the signal-settled-state holding circuit and to the node for receiving the data signal to latch the data signal in response to the second timing signal, wherein the signal-settled-state holding circuit is configured to maintain a signal-settled state of the second timing signal for a predetermined duration following a change of the first timing signal into an unstable state.

According to at least one embodiment of the invention, the signal-settled-state holding circuit can maintain for the predetermined duration the signal settled state of the second timing signal that indicates the latch timing of the second flip-flop. As a result, the second flip-flop can maintain stored data for a desired time period following the latching of the data in the second flip-flop. The length of time during which the signal-settled-state holding circuit maintains the signal settled state determines the length of the signal settled state of the latch timing signal and hence the length of time during which the data signal is held. Because of this, it is possible to achieve a stable read-data latching operation without being significantly influenced by the delay time of the delay circuit or by other operating conditions. Further, since the delay of the delay circuit and other operating conditions are provided with sufficient margins, there is sufficient flexibility in setting the operating conditions, which facilitates a simpler design.

In the following, embodiments of the present invention will be described with reference to the accompanying drawings.

Figure 18:
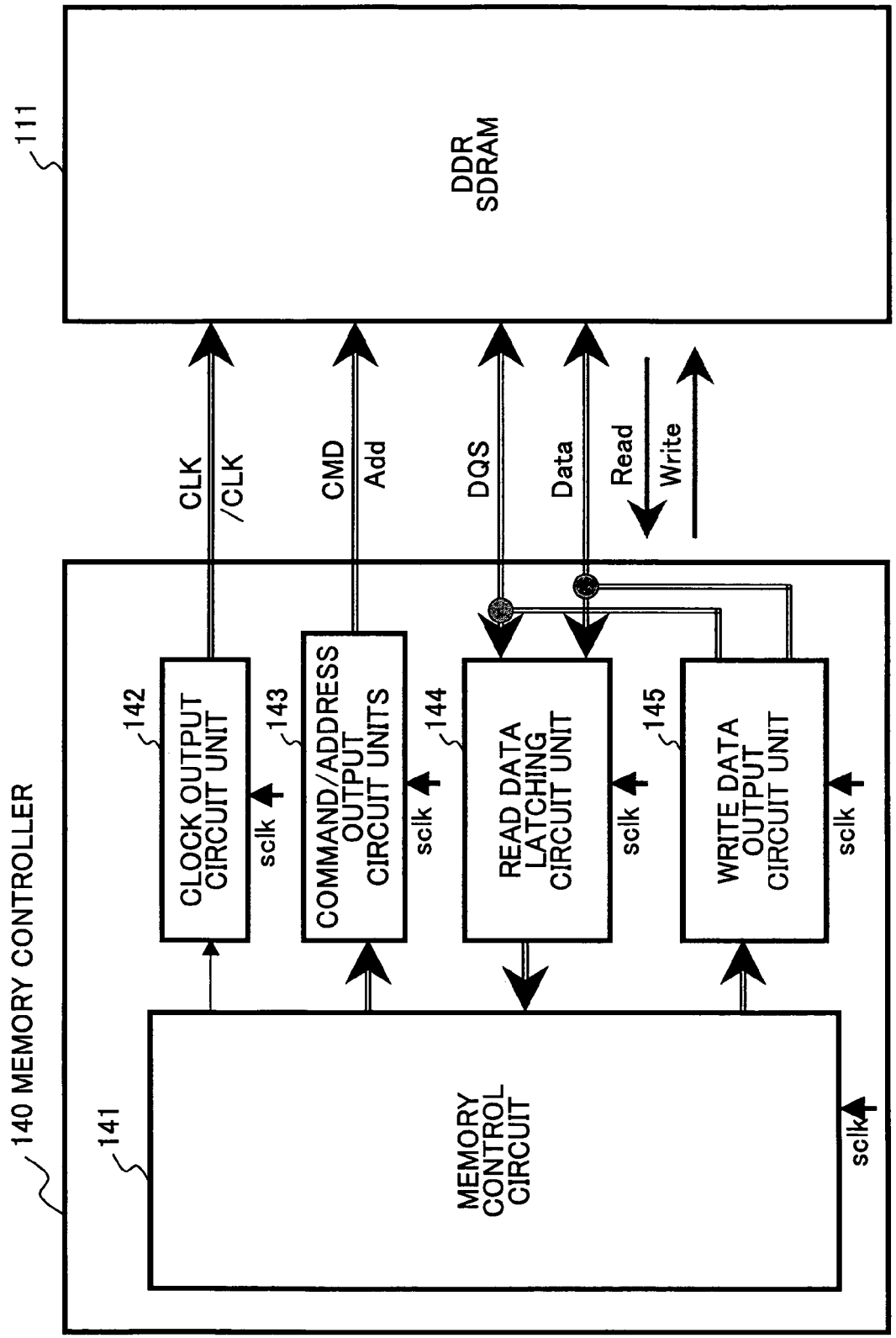
FIG. 18 is a block diagram showing the construction of a memory controller to which the present invention is applied.

FIG. 18 is a block diagram showing the construction of a memory controller to which the present invention is applied. A memory controller 140 includes a memory control circuit 141, a clock output circuit unit 142, a command/address output circuit unit 143, a read data latching circuit unit 144, and a write data output circuit unit 145. Between the memory controller 140 and the memory (DDRDRAM) 111, signal lines for coupling are provided on a printed circuit board, allowing the exchange of a data signal Data, a data strobe signal DQS, a command/address signal CMD/Add, clock signals CLK and /CLK, etc.

The memory 111 conforms to the DDRSDRAM specification. A command signal and address signal are supplied from the memory controller 140 to the memory 111 at positive edges of the clock signal CLK. Data transfer between the memory controller 140 and the memory 111 is performed in synchronization with the two-way data strobe signal DQS.

The data strobe signal DQS is output simultaneously with data by the device on the data transmission side. During the write operation, the memory controller 140 supplies the data strobe signal DQS. During the read operation, the memory 111 transmits the data strobe signal DQS. Access to the memory 111 is performed in the form of burst operation, in which the reading of data starts at a specified position, and the specified number of data items are continuously read in the specified order. To be specific, a read operation conforming to the read specification of the DDRSDRAM as shown in FIG. 15 is performed.

The memory control circuit 141 controls the clock output circuit unit 142, the command/address output circuit unit 143, the read data latching circuit unit 144, and the write data output circuit unit 145, thereby attending to the exchange of signals with the memory 111. To be specific, the command/address output circuit unit 143 supplies the command signal CMD and the address signal Add to the memory 111. The command signal CMD specifies a read operation, a write operation, etc. The address signal Add specifies a read address and a write address.

The clock output circuit unit 142 generates the clock signal CLK and the inverted clock signal /CLK based on the system clock sclk, and supplies the generated clock signals to the memory 111. In synchronization with the clock signals CLK and /CLK, the memory 111 performs its core operations. In the case of a write operation, the write data output circuit unit 145 outputs a write data signal Data together with the data strobe signal DQS, and the memory 111 writes the write data to a specified address. In the case of a read operation, the memory 111 outputs a read data signal Data together with the data strobe signal DQS, and the read data latching circuit unit 144 latches the read data in synchronization with the data strobe signal DQS. Each circuit unit of the memory controller 140 operates in synchronization with the system clock sclk supplied from the exterior.

Figure 19:
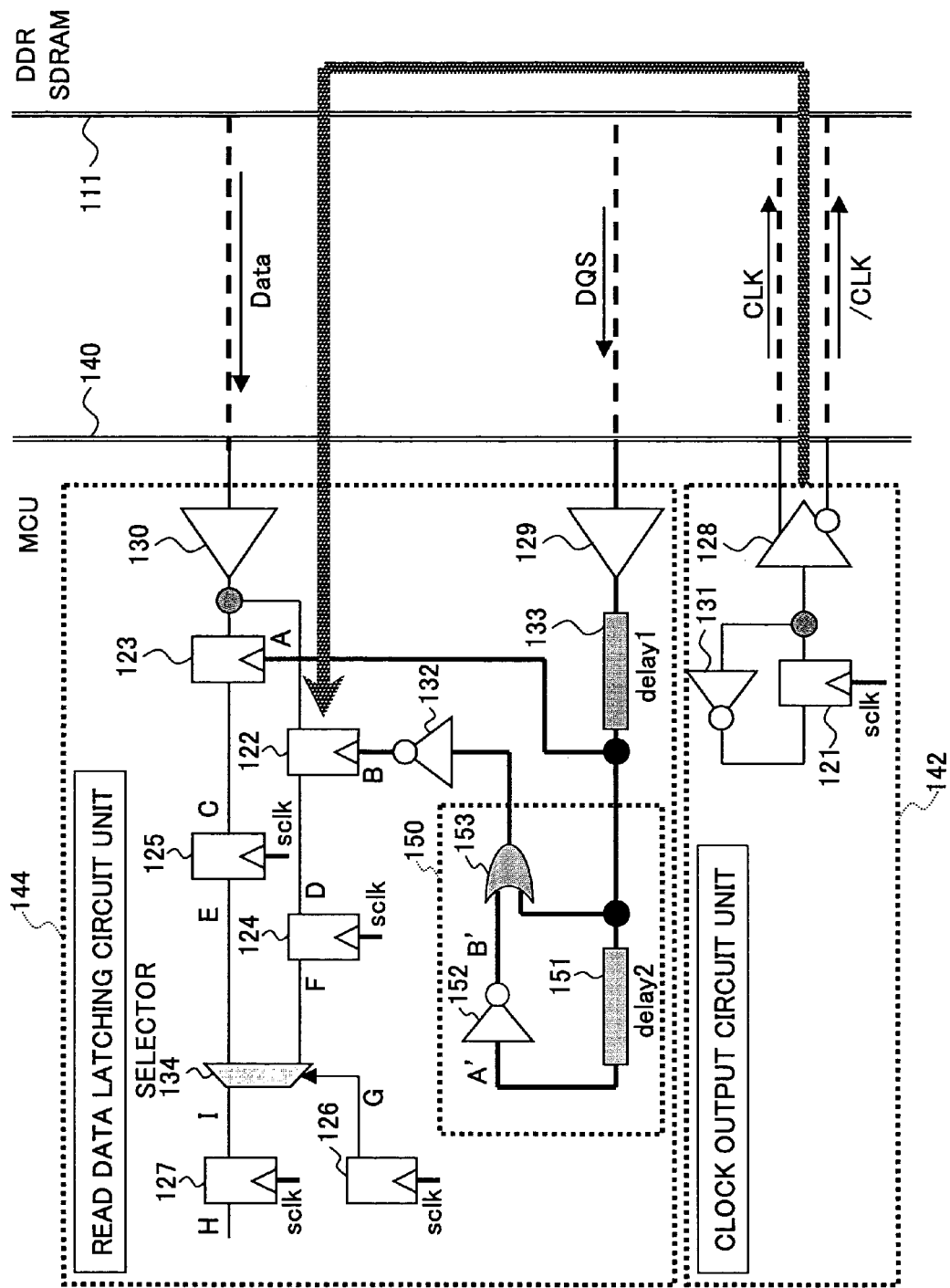
FIG. 19 is a circuit diagram showing an embodiment of a clock output circuit unit and a read data latching circuit unit of the memory controller.

FIG. 19 is a circuit diagram showing an embodiment of the clock output circuit unit 142 and the read data latching circuit unit 144 of the memory controller 140. In FIG. 19, the same elements as those of FIG. 16 are referred to by the same numerals, and a description thereof will be omitted.

The clock output circuit unit 142 includes the flip-flop 121, the inverter 131, and the output buffer 128. The read data latching circuit unit 144 includes the flip-flops 122 through 127, the input buffers 129 and 130, the inverter 132, the delay circuit 133, the selector 134, and a signal-settled-state holding circuit 150. The signal-settled-state holding circuit 150 includes a delay circuit 151, an inverter 152, and an OR gate 153. As will be described later, the signal-settled-state holding circuit 150 controls a signal so that the timing signal B for the flip-flop 122 maintains its settled signal state for a desired time period.

The delay circuit 133 and the delay circuit 151 may be implemented by use of simple delay buffers. Alternatively, the delay circuit 133 and the delay circuit 151 may be implemented by use of programmable delay circuits or DLL (delay locked loop) circuits, as will be described later in other embodiments.

Figure 20:
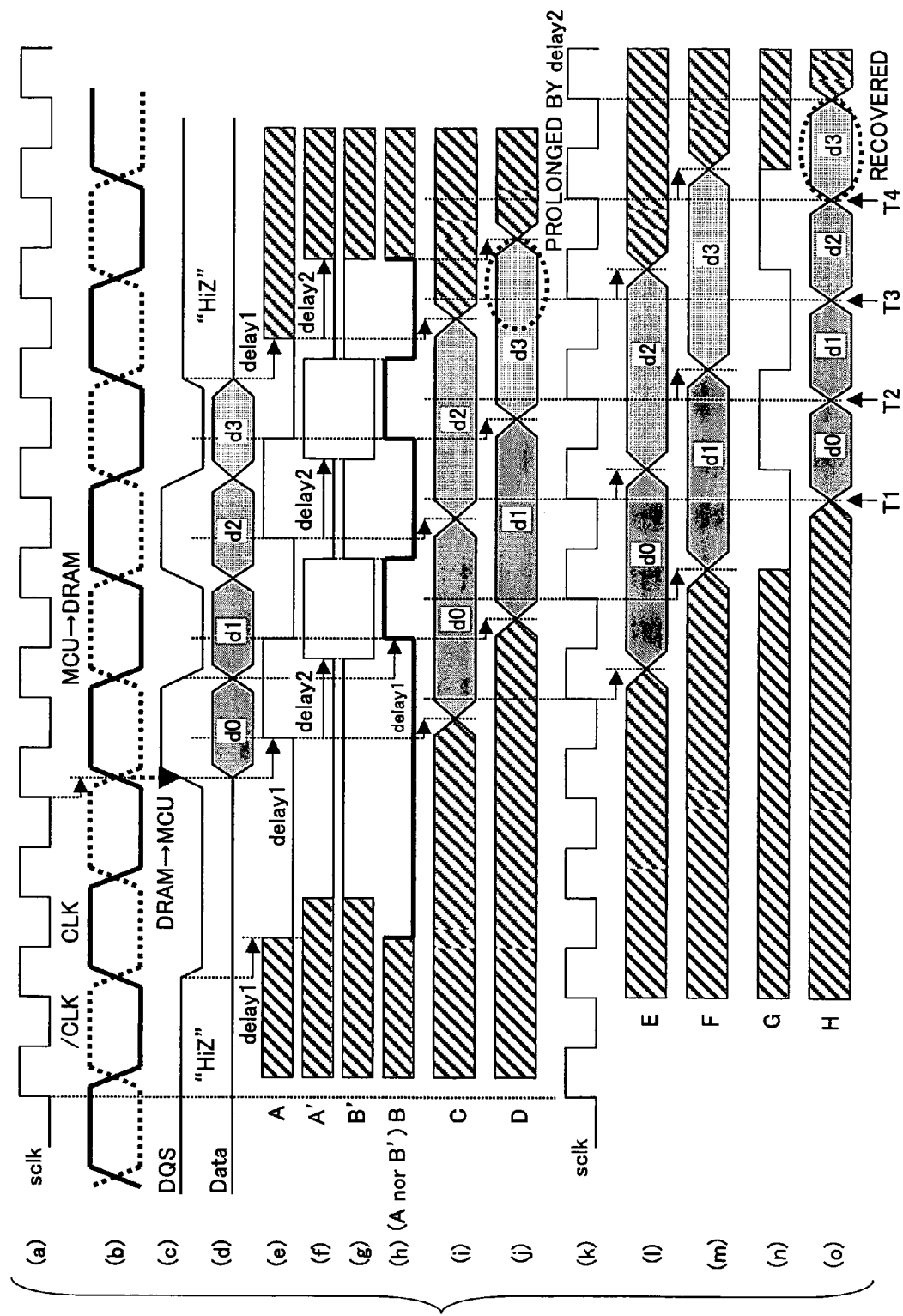
FIG. 20 is a timing chart for explaining the operation of the circuit shown in FIG. 19.

FIG. 20 is a timing chart for explaining the operation of the circuit shown in FIG. 19. In the following, the latching of read data according to the present invention will be described with reference to FIG. 19 and FIG. 20.

In FIG. 19, the flip-flop 121 latches an inversion of its own output signal by responding to a trigger that is a rising edge of the system clock sclk, thereby generating a clock signal having double the cycle of the system clock sclk. Based on this clock signal, the output buffer 128 supplies the clock signal CLK and the inverted clock signal /CLK to the memory 111. The memory 111 reads data from the memory core circuit in synchronization with the clock signal CLK and the inverted clock signal /CLK, and outputs the data signal Data together with the data strobe signal DQS. What is described here is shown in FIG. 20-(*a*) to FIG. 20-(*d*). The data signal Data is in synchronization with the data strobe signal DQS, and the four data items d0 through d3 are output in the form of burst operation.

In FIG. 19, the input buffer 129 of the memory controller 140 receives the data strobe signal DQS output from the memory 111. The received data strobe signal DQS is supplied from the input buffer 129 to the flip-flop 123 as a latch timing signal A through the delay circuit 133, and is also supplied from the input buffer 129 to the flip-flop 122 as a latch timing signal B through the delay circuit 133, the signal-settled-state holding circuit 150, and the inverter 132. The latch timing signals A and B are shown in FIGS. 20-(*e*) and (*h*).

In the signal-settled-state holding circuit 150, the delay circuit 151 delays the output of the delay circuit 133 (latch timing signal A) by a predetermined delay time (delay2). This delayed signal A' is shown in FIG. 20-(*f*). The inverter 152 inverts the signal A' to generate a signal B' as shown in FIG. 6-(*g*). In the signal A' and the signal B', the state in which the signal is settled is prolonged by a length equal to the delay time delay2, compared to the signal A, as shown in FIGS. 20-(*f*) and (*g*).

As a result, the latch timing signal B shown in FIG. 20-(*h*) also has its signal settled state prolonged by a length equal to the delay time delay2, compared to the signal A. In other words, the state in which the signal is unstable is masked for the duration equal to the time delay delay2. In this manner, the present invention successfully maintains the signal settled state of the latch timing signal B for a desired duration. As a result, it becomes possible to maintain stored data for a desired duration following the latching of the received data signal d3 by the flip-flop 122, as will be described later.

The input buffer 130 of the memory controller 140 receives the data signal Data transmitted from the memory 111. The received data signal Data is latched by the flip-flop 123 at a positive transition of the signal A, and is latched by the flip-flop 122 at a positive transition of the signal B. A signal C latched by the flip-flop 123 is shown in (i) of FIG. 20, and a signal D latched by the flip-flop 122 is shown in (j) of FIG. 20.

In this manner, data latching at a double rate (i.e., double the rate of the clock signal CLK) is achieved. In the signal D shown in (j) of FIG. 20, the read data d3 is maintained for the time period during which the latch timing signal B maintains its signal settled state. Accordingly, the read data d3 is not destroyed together with the disappearance of the read data d2, unlike the related-art operations shown in FIG. 17.

The flip-flops 125 and 124 of FIG. 19 latch the signal C and signal D, respectively, in synchronization with the positive transitions of the system clock sclk, thereby outputting a signal E and signal F, respectively. With this provision, the latched data are synchronized with the system clock sclk of the control circuit. The signal E and signal F synchronized with the system clock sclk are shown in (l) and (m) of FIG. 20. In the signal F shown in (m) of FIG. 20, the read data d3 is maintained for a desired duration without being destroyed together with the disappearance of the read data d2, unlike the related-art operations shown in FIG. 17-(*k*).

The selector 134 of FIG. 19 receives a clock signal G made by dividing the frequency of the system clock sclk by half by the flip-flop 126, and selects the signal E and the signal F alternately in synchronization with the clock signal G, thereby outputting a signal I. Specifically, the signal E is selected and output when the signal G is LOW, and the signal F is selected and output when the signal G is HIGH. The flip-flop 127 latches the signal I in synchronization with the system clock sclk, thereby outputting a data signal H that is synchronized with the system clock sclk. The selector control signal G is shown in (n) of FIG. 20, and the data signal H is shown in (o) of FIG. 20.

In detail, the signal E shown in (l) of FIG. 20 is latched at the rising edges of the system clock sclk at timing T1 and timing T3, thereby producing d0 and d2 of the data signal H shown in (o) of FIG. 20. Moreover, the signal F shown in (m) of FIG. 20 is latched at the rising edges of the system clock sclk at timing T2 and timing T4, thereby producing d1 and d3 of the data signal H shown in (o) of FIG. 20. Since the read data d3 of the signal F is maintained for a proper duration, the flip-flop 127 properly latches the read data d3 at timing T4.

In the manner as described above, all the read data items d0 through d3 are present in the data signal H synchronized with the system clock sclk. Further, the delay length delay2 of the delay circuit 151 in the signal-settled-state holding circuit 150 controls the time length during which the latch timing signal B remains in the signal settled state, i.e., the time length during which the read data d3 of the signal F is maintained. Because of this, it is possible to achieve a stable operation without being significantly influenced by the delay time delay1 of the delay circuit 133 or by other operating conditions. Further, since the delay length of the delay circuit 133 and other operating conditions are provided with sufficient margins, there is sufficient flexibility in setting the operating conditions, which facilitates a simpler design.

Figure 21:
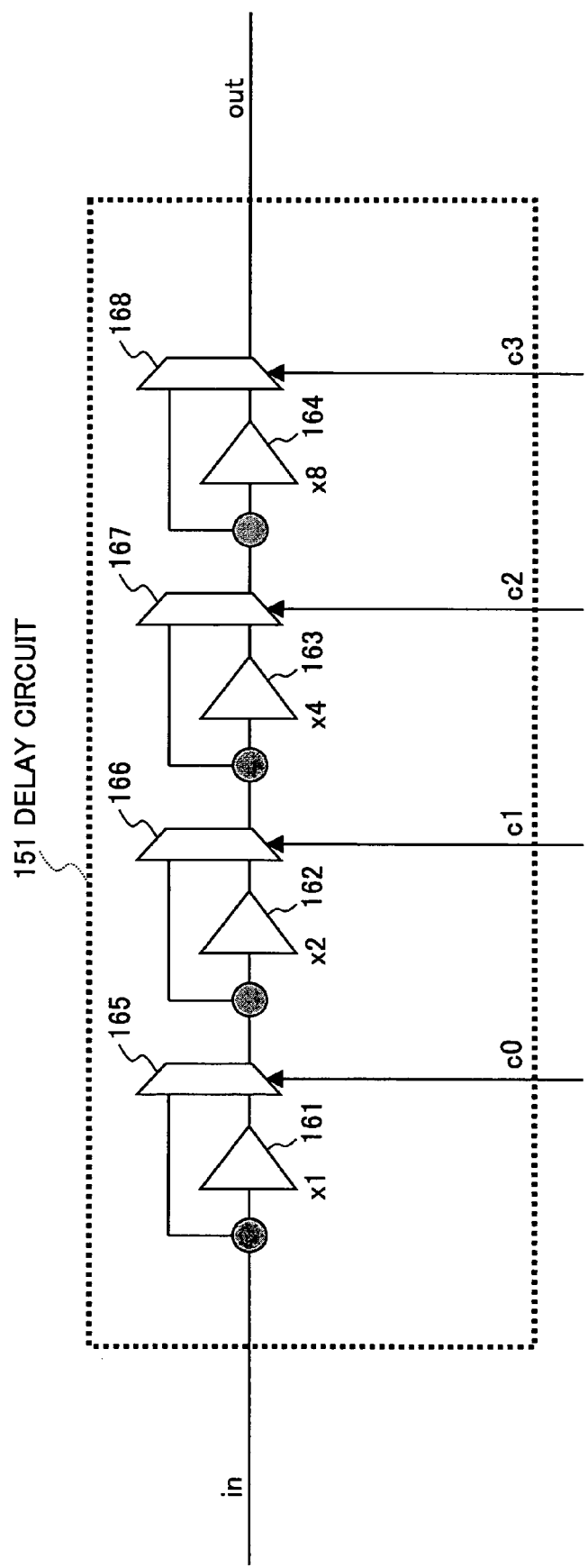
FIG. 21 is a circuit diagram showing an example of the circuit construction of a delay circuit.

FIG. 21 is a circuit diagram showing an example of the circuit construction of the delay circuit 151. The same circuit construction may be used for the delay circuit 133. As can be understood from the above description, the delay of the delay circuit 151 is an important parameter that determines the success or failure as well as stability of the latching of read data in the memory controller 140. It is thus preferable to be able to set this parameter to any desired value.

The delay circuit 151 of FIG. 21 includes delay buffers 61 through 64 and selectors 65 through 68. The selecting operations of the selectors 65 through 68 are controlled based on the control signals c1 through c3, respectively. In each selector, an input into the upper input node is selected when the control signal is 0, for example, and an input into the lower input node is selected when the control signal is 1. If all the control signals c1 through c3 are 0, for example, an input signal "in" passes the selectors 65 through 68 without passing through the delay buffers 61 through 64 to be provided as an output signal out. In this case, the delay is zero if the delays of the selectors are disregarded. If all the control signals c1 through c3 are 1, the input signal "in" passes the delay buffers 61 through 64 to be provided as the output signal out. In this case, the amount of delay is the maximum delay that can be provided by the delay circuit 151.

As shown in FIG. 21, the delay buffers 61 through 64 have a delay of a unit length, a delay twice as long as the unit length, a delay four times as long as the unit length, and a delay eight times as long as the unit length, respectively. If the values of the control signals c1 through c3 are stored in a 4-bit register, the delay circuit 151 can provide a delay proportional to a binary value (0-15) that is set in this register. For example, a cycle time may be computed by a program in the memory controller 40, thereby providing for a proper delay time to be set. This provides a programmable delay circuit.

Figure 22:
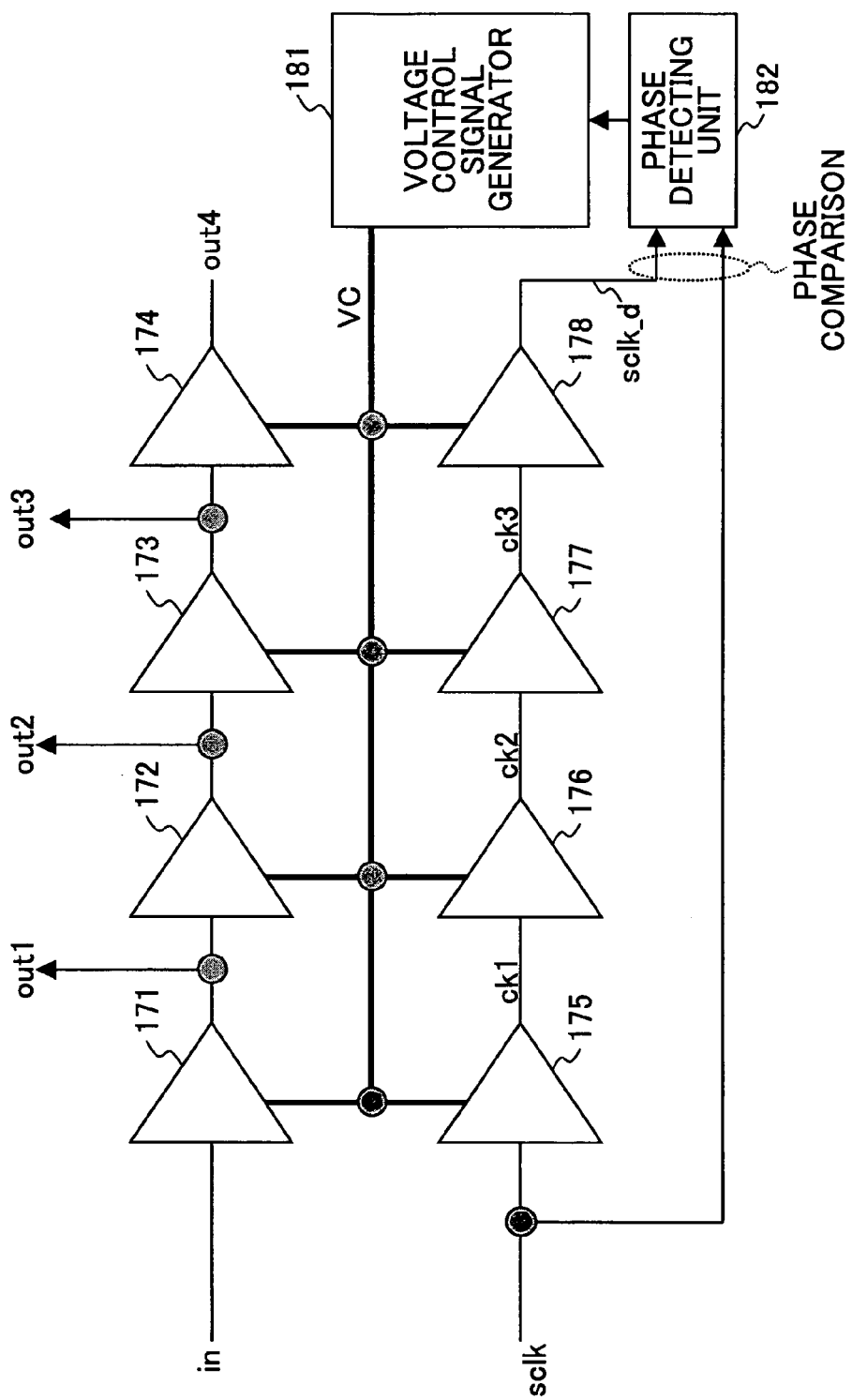
FIG. 22 is a circuit diagram showing another example of the circuit construction of the delay circuit.

FIG. 22 is a circuit diagram showing another example of the circuit construction of the delay circuit 151. The same circuit construction may be used to implement the delay circuit 133. The delay of the delay circuit 151 of FIG. 21 is a predetermined value that is set up by a register setting value or the like, and remains fixed unless the register setting value is changed even if the operating frequency of the memory controller 40 changes. With the construction shown in FIG. 24, on the other hand, the delay length is dynamically selected in response to the operating frequency.

The delay circuit 151 of FIG. 22 includes voltage-controlled delay elements 171 through 178, a voltage control signal generator 181, and a phase detecting unit 182. The voltage control delay elements 171 through 178 provide signal delays that change in response to the voltage level of a voltage control signal VC supplied from the voltage control signal generator 181. The voltage control delay elements 171 through 174 are connected in series to form a delay line, and the voltage control delay elements 175 through 178 are connected in series to form another delay line.

The delay line formed by the voltage control delay elements 175 through 178 receives the system clock sclk as an input signal, and delays the received signal to output a delay clock sclk_d. The phase detecting unit 182 detects a phase difference between the system clock sclk and the delay clock sclk_d, and supplies a signal responsive to the detected phase difference to the voltage control signal generator 181.

The voltage control signal generator 81 adjusts the potential level of the voltage control signal VC in response to the signal from the phase detecting unit 182, thereby controlling the delay of the voltage control delay elements 175 through 178. In so doing, the voltage control signal generator 181 adjusts the potential level of the voltage control signal VC such that the phase difference detected by the phase detecting unit 182 becomes zero. To be specific, the voltage control signal VC is so changed as to increase the delay of the voltage control delay elements 175 through 178 when the phase of the delay clock sclk_d is earlier than the phase of the system clock sclk. When the phase of the delay clock sclk_d is later than the phase of the system clock sclk, the voltage control signal VC is so changed as to decrease the delay of the voltage control delay elements 175 through 178. The provision is thus made to form a DLL (delay locked loop) circuit.

Figure 23:
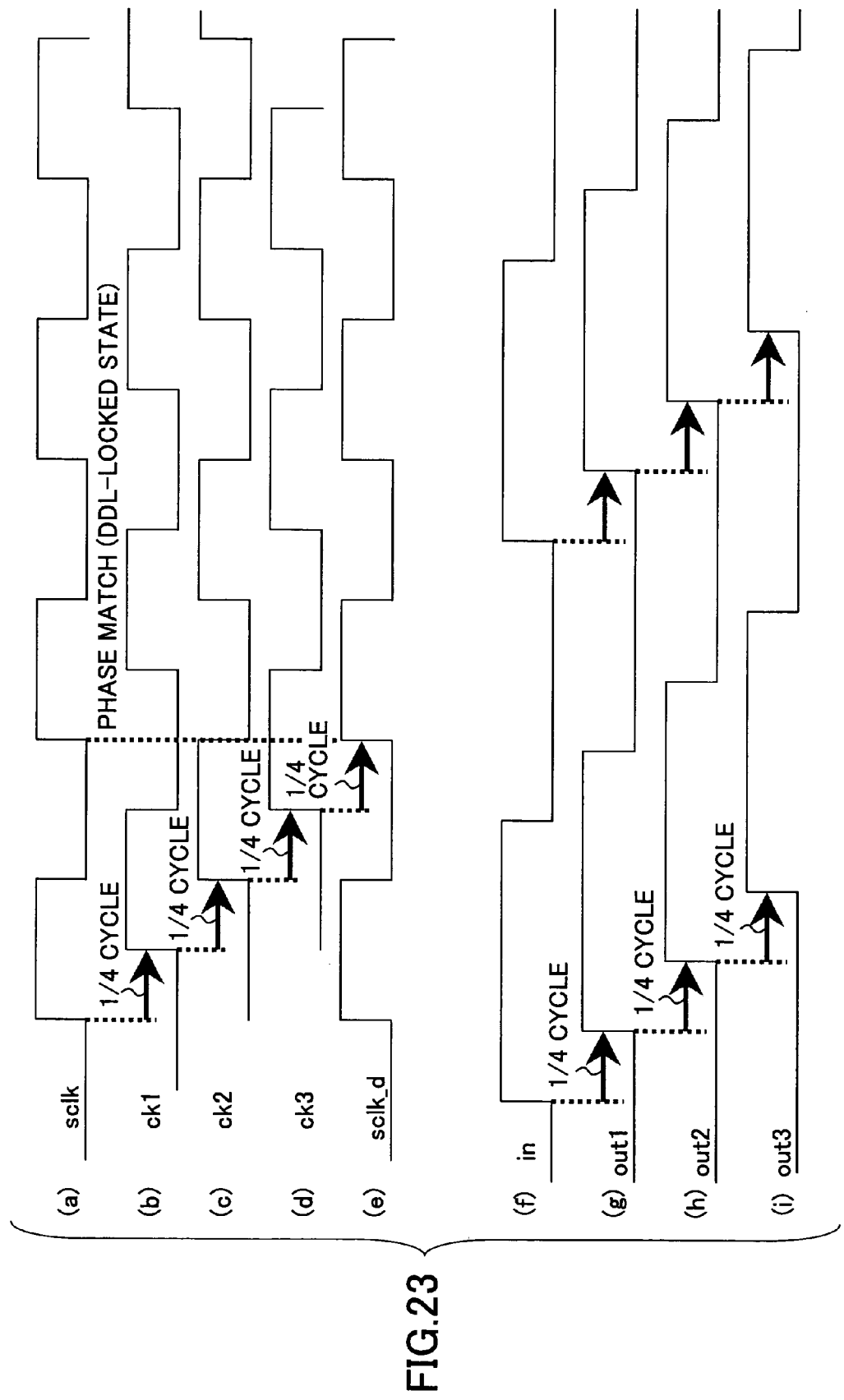
FIG. 23 is a timing chart for explaining the operation of the circuit shown in FIG. 22.

Through the control operation as described above, the delay of the voltage control delay elements 175 through 178 is adjusted such that the phase of the delay clock sclk_d becomes identical to the phase of the system clock sclk. That is, the delay of the voltage control delay elements 175 through 178 is set to a length equal to one cycle of the system clock sclk. The voltage control delay elements 175 through 178 have the same configuration, and the delay of each element is the same. The system clock sclk, the outputs ck1 through ck3 of the respective voltage control delay elements 175 through 177, the output sclk_d of the voltage control delay element 178 are shown in (a) through (e) of FIG. 23.

The voltage control delay elements 171 through 174 has the same configuration as the voltage control delay elements 175 through 178, and are controlled by the same voltage control signal VC. It follows that the delay of the voltage control delay elements 171 through 174 and the delay of the voltage control delay elements 175 through 178 are the same. Consequently, an output signal out1 is delayed by a quarter of the cycle of the system clock sclk relative to an incoming signal "in", and an output signal out2 is delayed by half a cycle of the system clock sclk relative to the incoming signal "in". Further, an output signal out3 is delayed by three quarters of the cycle of the system clock sclk relative to the incoming signal "in", and an output signal out4 is delayed by one cycle of the system clock sclk relative to the incoming signal "in". The incoming signal "in" and the output signals out1 through out3 are shown in (f) through (i) of FIG. 23, respectively. A signal having a proper delay is selected from these output signals as the output signal of the delay circuit 151.

Figure 24:
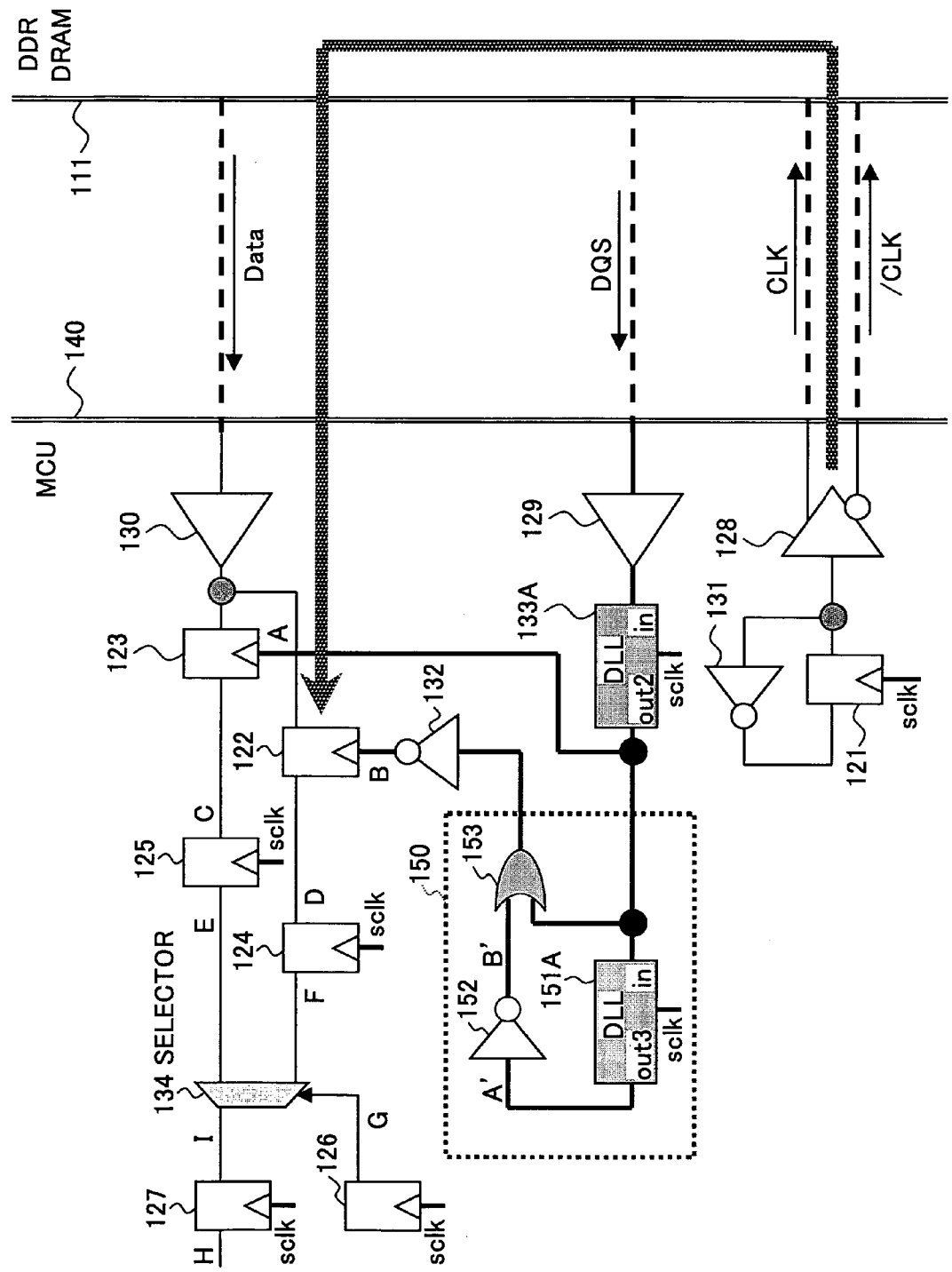
FIG. 24 is a circuit diagram showing another embodiment of the clock output circuit unit and the read data latching circuit unit of the memory controller.

FIG. 24 is a circuit diagram showing another embodiment of the clock output circuit unit 142 and the read data latching circuit unit 144 of the memory controller 140. In FIG. 24, the same elements as those of FIG. 19 are referred to by the same numerals, and a description thereof will be omitted.

In comparison with the embodiment of FIG. 19, the embodiment shown in FIG. 24 uses a DLL circuit 133A in place of the delay circuit 133, and uses a DLL circuit 151A in place of the delay circuit 151.

As the output signal of the DLL circuit 151A, it is preferable to use a signal having a delay approximately ranging from three quarters of a cycle to four quarters of a cycle of the system clock sclk. The signal having a delay equal to four quarters of a cycle (i.e., equal to one cycle) may be used, for example. In this case, the duration of the read data d3 appearing in the signal D latched by the flip-flop 122 shown in (j) of FIG. 20 becomes equal to one cycle of the data strobe signal DQS, which is the same as the duration of the other read data d0 through d2. In the example shown in FIG. 24, the signal out3, which is delayed by three quarters of a cycle, is output as the output signal.

As the output signal of the DLL circuit 133A, it is preferable to use a signal having a delay equal to half a cycle of the system clock sclk. With this provision, a data latching operation is performed at the timing exactly at the midpoint of each data valid period of the data signal Data shown in FIG. 20-(d).

As described in connection with the operation of FIG. 22, the delay of the DLL circuit is dynamically adjusted in response to the length of the cycle of the system clock sclk. In the embodiment shown in FIG. 24, the delay is automatically adjusted to provide an optimum delay length at all times even if the system clock sclk changes.

Figure 25:
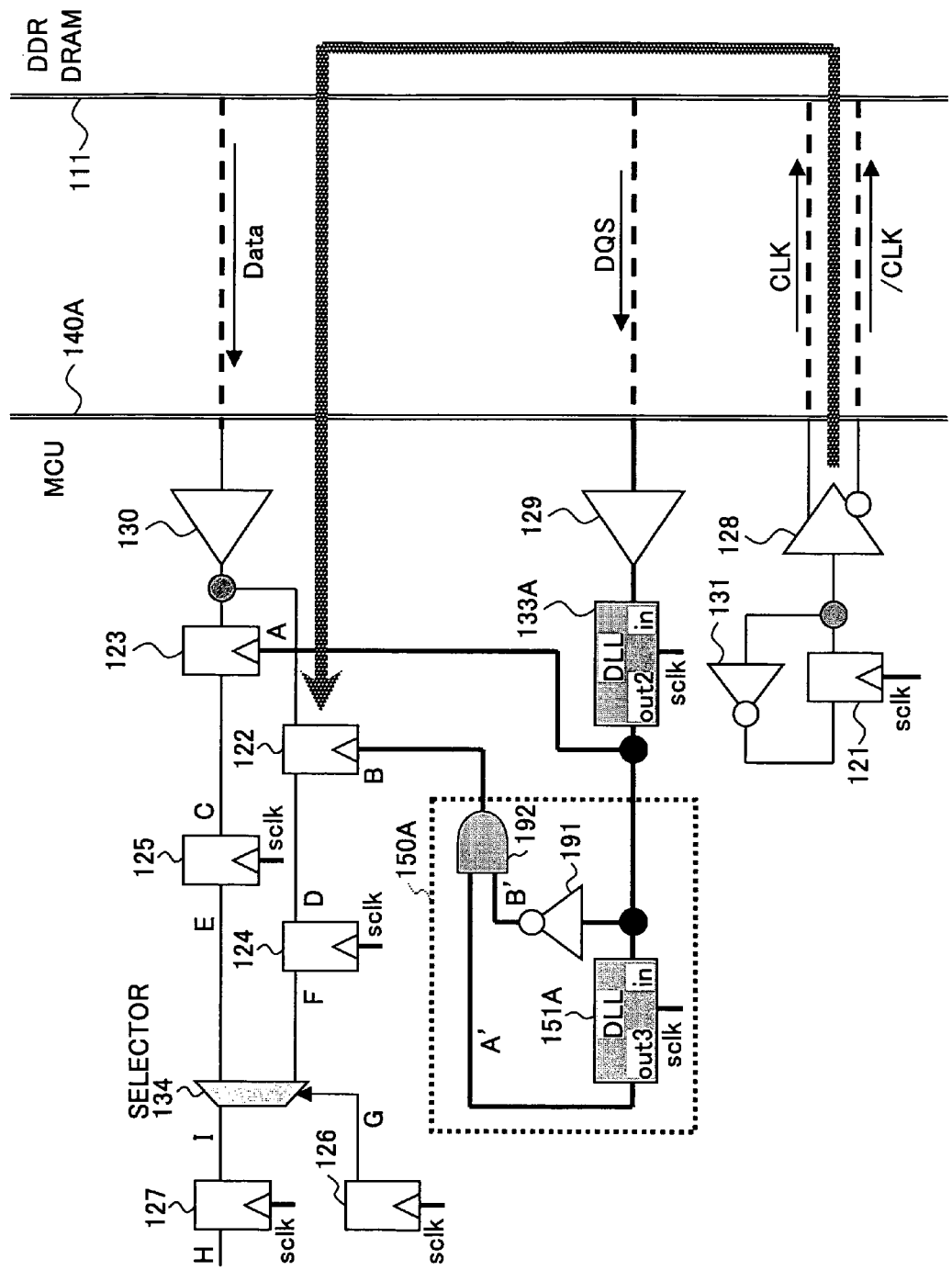
FIG. 25 is a circuit diagram showing still another embodiment of the clock output circuit unit and the read data latching circuit unit of the memory controller.

FIG. 25 is a circuit diagram showing still another embodiment of the clock output circuit unit and the read data latching circuit unit of the memory controller. In FIG. 25, the same elements as those of FIG. 19 are referred to by the same numerals, and a description thereof will be omitted.

In the embodiment of FIG. 25, a memory controller 140A includes a signal-settled-state holding circuit 150A in place of the signal-settled-state holding circuit 150 of FIG. 24. Moreover, the inverter 132 shown in FIG. 24 is removed in FIG. 25. The signal-settled-state holding circuit 150A includes a DLL circuit 151A, an inverter 191, and an AND gate 192. The signal-settled-state holding circuit 150A implements the same circuit logic as the circuit portion that is comprised of the signal-settled-state holding circuit 150 and the inverter 132 in FIG. 24. Namely, the latch timing signal B input into the flip-flop 122 in FIG. 24 is logically identical to the latch timing signal B that is input into the flip-flop 122 in FIG. 25.

In the embodiment of FIG. 25, the signal-settled-state holding circuit 150A is provided as a circuit that implements the same circuit logic as in the embodiment of FIG. 24. Alternatively, another circuit having different circuit logic may be used. All that is required is that an unstable signal state caused by the HIGH impedance state of the data strobe signal DQS received by the input buffer 129 does not destroy the data stored in the flip-flop 122 for a predetermined period of time.

Further, the present invention is not limited to these embodiments, but various variations and modifications may be made without departing from the scope of the present invention.

What is claimed is:

1. A circuit for timing adjustment, comprising:
a PLL circuit configured to generate a phase-adjusted clock signal in response to phase comparison between an input clock signal and a delayed clock signal;
a feedback path configured to delay the phase-adjusted clock signal for provision as the delayed clock signal to said PLL circuit;
a first timing correction circuit configured to add a pre-determined delay time to said feedback path;
an output data circuit directly coupled to a node to receive the phase-adjusted clock signal from the PLL circuit through the node and configured to supply output data at first timing indicated by the phase-adjusted clock signal;
a second timing correction circuit directly coupled to said node to receive the phase-adjusted clock signal from the PLL circuit through the node and configured to delay the phase-adjusted clock signal by a delay time equal to the predetermined delay time to generate a further-delayed clock signal indicating second timing different from the first timing; and
an input data circuit configured to receive the further-delayed clock signal and to latch input data at the second timing indicated by the further-delayed clock signal.

2. A circuit for timing adjustment, comprising:
a PLL circuit configured to generate a phase-adjusted clock signal in response to chase comparison between an input clock signal and a delayed clock signal;
a feedback path configured to delay the phase-adjusted clock signal for provision as the delayed clock signal to said PLL circuit;
a first timing correction circuit configured to add a pre-determined delay time to said feedback path;
an output data circuit configured to supply output data at first timing responsive to the phase-adjusted clock signal;
a second timing correction circuit configured to delay the first timing by the predetermined delay time to generate second timing different from the first timing;
an input data circuit configured to latch input data at the second timing;
a clock input circuit configured to delay an external clock signal by a first delay time for provision as the input clock signal to said PLL circuit; and
a data output circuit configured to output the output data to an exterior after a second delay time following the supply of the output data from said output data circuit,
wherein the predetermined delay time of said first timing correction circuit and said second timing correction circuit is substantially equal to a sum of the first delay time and the second delay time.

3. The circuit as claimed in claim 2, wherein each of said first timing correction circuit and said second timing correction circuit includes:
a first circuit having a same configuration as said clock input circuit; and
a second circuit having a same configuration as said data output circuit, said first circuit and said second circuit coupled together in series.

4. The circuit as claimed in claim 2, wherein a pin for outputting the output data to the exterior and a pin for inputting the input data from the exterior are one and the same, said data output circuit configured to be selectively set to a HIGH impedance state, the setting of the HIGH impedance state being controlled at the first timing.

5. A circuit for timing adjustment, comprising:
a PLL circuit configured to generate a phase-adjusted clock signal in response to phase comparison between an input clock signal and a delayed clock signal;
a feedback path configured to delay the phase-adjusted clock signal for provision as the delayed clock signal to said PLL circuit;
a first timing correction circuit configured to add a pre-determined delay time to said feedback path;
an output data circuit configured to supply output data at first timing responsive to the phase-adjusted clock signal;
a second timing correction circuit configured to delay the first timing by the predetermined delay time to generate second timing different from the first timing; and
an input data circuit configured to latch input data at the second timing;
wherein each of said first timing correction circuit and said second timing correction circuit further includes terminal pins connectable to the exterior, wherein a long-distance wire is to be connected to said terminal pins to include a delay time of the long-distance wire in each of said first timing correction circuit and said second timing correction circuit.

6. A circuit for timing adjustment, comprising:
a PLL circuit configured to generate a phase-adjusted clock signal in response to phase comparison between an input clock signal and a delayed clock signal;
a feedback oath configured to delay the phase-adjusted clock signal for provision as the delayed clock signal to said PLL circuit;
a first timing correction circuit configured to add a predetermined delay time to said feedback path;
an output data circuit configured to supply output data at first timing responsive to the phase-adjusted clock signal;
a second timing correction circuit configured to delay the first timing by the predetermined delay time to generate second timing different from the first timing;
an input data circuit configured to latch input data at the second timing; and
a phase compensation circuit configured to shift a phase by 180 degrees on a path along which the second timing is generated.

7. The circuit as claimed in claim 6, wherein said phase compensation circuit is an inverter.

8. The circuit as claimed in claim 6, wherein said phase compensation circuit includes two flip-flops configured to operate in synchronization with a clock signal having twice as high a frequency as a frequency of the input clock signal.

9. A circuit for timing adjustment, comprising:
a PLL circuit configured to generate a phase-adjusted clock signal in response to phase comparison between an input clock signal and a delayed clock signal;
a feedback path configured to delay the phase-adjusted clock signal for provision as the delayed clock signal to said PLL circuit;
a first timing correction circuit configured to add a predetermined delay time to said feedback path;
an output data circuit configured to supply output data at first timing responsive to the phase-adjusted clock signal;
a second timing correction circuit configured to delay the first timing by the predetermined delay time to generate second timing different from the first timing;
an input data circuit configured to latch input data at the second timing;
wherein said PLL circuit includes:
a phase difference detecting circuit configured to detect a phase difference between the input clock signal and the delayed clock signal;
a control voltage generating circuit configured to generate a control voltage responsive to an output of said phase difference detecting circuit; and
a VCO configured to generate the phase-adjusted clock signal by oscillating at frequency responsive to the control voltage.

10. The circuit as claimed in claim 1, wherein said PLL circuit includes:
a phase difference detecting circuit configured to detect a phase difference between the input clock signal and the delayed clock signal;
a delay control circuit configured to generate a control signal responsive to an output of said phase difference detecting circuit; and a variable delay circuit configured to generate the phase-adjusted clock signal by delaying the input clock signal by a delay time responsive to the control signal.

11. A memory controller, comprising:
a delay circuit coupled to a node for receiving a data strobe signal to output a first timing signal including a first latching edge delayed by a predetermined delay from a first edge of the data strobe signal;
a first flip-flop coupled to an output of said delay circuit and to a node for receiving a data signal to latch the data signal in response to the first timing signal;
a signal-settled-state holding circuit coupled to the output of said delay circuit to output a second timing signal including a second latching edge delayed by the predetermined delay from a second edge of the data strobe signal; and
a second flip-flop coupled to an output of said signal-settled-state holding circuit and to the node for receiving the data signal to latch the data signal in response to the second timing signal,
wherein said signal-settled-state holding circuit is configured to maintain a signal-settled state of the second timing signal for a predetermined duration following a change of the first timing signal into an unstable state.

12. The memory controller as claimed in claim 11, wherein the unstable state of the first timing signal corresponds to a HIGH impedance state of the data strobe signal.

13. The memory controller as claimed in claim 11, further comprising a third flip-flop coupled to outputs of said first and second flip-flops to latch the data signal stored in said first flip-flop and the data signal stored in said second flip-flop alternately, the predetermined duration being a length that allows said third flip-flop to latch the data signal stored in said second flip-flop.

14. The memory controller as claimed in claim 11, wherein said signal-settled-state holding circuit includes a delay buffer having a fixed delay, the delay of said delay buffer determining the predetermined duration.

15. The memory controller as claimed in claim 11, wherein said signal-settled-state holding circuit includes a programmable delay circuit, a delay of said programmable delay circuit determining the predetermined duration.

16. The memory controller as claimed in claim 15, wherein said programmable delay circuit includes:
a plurality of delay elements; and
a plurality of selectors, said delay elements and said selectors being alternately arranged in a series connection, and one of said selectors configured to select as an output thereof either an output from a preceding delay element or an input into the preceding delay element.

17. The memory controller as claimed in claim 11, wherein said signal-settled-state holding circuit includes a DLL circuit, a delay of said DLL circuit determining the predetermined duration.

18. The memory controller as claimed in claim 11, wherein said DLL circuit includes:
a first delay line configured to delay a first clock signal to output a second clock signal;
a phase detecting unit configured to compare a phase of the first clock signal and a phase of the second clock signal;
a control signal generating unit configured to generate a control signal for controlling a delay of said first delay line in response to a result of the phase comparison by said phase detecting unit; and a second delay line coupled to the output of said delay circuit, said second delay line having a delay thereof controlled by the control signal.

19. A memory controller, comprising:

a first delay circuit coupled to a node for receiving a data strobe signal to output a first timing signal including a first latching edge delayed by a predetermined delay from a first edge of the data strobe signal;

a first flip-flop coupled to an output of said first delay circuit and to a node for receiving a data signal to latch the data signal in response to the first timing signal;

a signal processing circuit coupled to the output of said first delay circuit to output a second timing signal including a second latching edge delayed by the predetermined delay from a second edge of the data strobe signal; and a second flip-flop coupled to an output of said signal processing circuit and to the node for receiving the data signal to latch the data signal in response to the second timing signal, wherein said signal processing circuit includes a second delay circuit configured to delay the first timing signal by a predetermined delay length.

20. The memory controller as claimed in claim 19, further comprising a third flip-flop coupled to outputs of said first and second flip-flops to latch the data signal stored in said first flip-flop and the data signal stored in said second flip-flop alternately, the predetermined delay length being a length that allows said third flip-flop to latch the data signal stored in said second flip-flop.

* * * * *